US011078575B2

(12) United States Patent

Mikami et al.

(10) Patent No.: US 11,078,575 B2

(45) Date of Patent: Aug. 3, 2021

(54) METHOD FOR PRODUCING BASE FOR METAL MASKS, METHOD FOR PRODUCING METAL MASK FOR VAPOR DEPOSITION, BASE FOR METAL MASKS, AND METAL MASK FOR VAPOR DEPOSITION

(71) Applicant: TOPPAN PRINTING CO., LTD., Tokyo (JP)

(72) Inventors: Naoko Mikami, Tokyo (JP); Sumika Tamura, Tokyo (JP); Reiji Terada, Tokyo (JP); Masashi Kurata, Tokyo (JP); Daisei Fujito, Tokyo (JP); Kiyoaki Nishitsuji, Tokyo (JP); Takehiro Nishi, Tokyo (JP)

(73) Assignee: TOPPAN PRINTING CO., LTD., Tokyo (JP)

(*) Notice: Subject to any disclaimer, the term of this patent is extended or adjusted under 35 U.S.C. 154(b) by 423 days.

(21) Appl. No.: 15/786,446

(22) Filed: Oct. 17, 2017

(65) Prior Publication Data

US 2018/0065162 A1 Mar. 8, 2018

Related U.S. Application Data

(63) Continuation of application No. PCT/JP2016/069350, filed on Jun. 29, 2016.

(30) Foreign Application Priority Data

Jul. 17, 2015 (JP) ............................ JP2015-143509
Aug. 31, 2015 (JP) ............................ JP2015-171440
Dec. 3, 2015 (JP) ............................ JP2015-237004

(51) Int. Cl.

*C23F 1/28* (2006.01)
*C23C 14/24* (2006.01)

(Continued)

(52) U.S. Cl.

CPC ................ *C23F 1/28* (2013.01); *B21B 1/227* (2013.01); *B21B 3/02* (2013.01); *B32B 15/015* (2013.01);

(Continued)

(58) Field of Classification Search

None

See application file for complete search history.

(56) References Cited

U.S. PATENT DOCUMENTS 3,160,752 A 12/1964 Bennett
6,620,554 B1 9/2003 Komatsu et al.

(Continued)

FOREIGN PATENT DOCUMENTS

CN 1534383 A 10/2004
CN 1793433 A 6/2006

(Continued)

OTHER PUBLICATIONS

Bennett et al., "Relation Between Surface Roughness on Specular Reflectance at Normal Incidence," J Opt Soc Am. Feb. 1961; 51(2): 123-129.

(Continued)

*Primary Examiner* — Jiong-Ping Lu

(74) *Attorney, Agent, or Firm* — Squire Patton Boggs (US) LLP

(57) ABSTRACT

A rolled metal sheet includes an obverse surface and a reverse surface that is a surface located opposite to the obverse surface. At least either one of the obverse surface and the reverse surface is a processing object. A method for manufacturing a metal mask substrate includes reducing a thickness of the rolled metal sheet to 10 μm or less by etching the processing object by 3 μm or more by use of an acidic etching liquid, and roughening the processing object so that the processing object becomes a resist formation (Continued)

surface that has a surface roughness Rz of 0.2 μm or more, thereby obtaining a metal mask sheet.

9 Claims, 8 Drawing Sheets

(51) Int. Cl.

| | |
|---|---|
| ***C23C 14/34*** | (2006.01) |
| ***C23F 1/16*** | (2006.01) |
| ***B21B 1/22*** | (2006.01) |
| ***B21B 3/02*** | (2006.01) |
| ***B32B 15/01*** | (2006.01) |
| ***B32B 15/04*** | (2006.01) |
| ***C23C 14/04*** | (2006.01) |
| ***C23C 16/04*** | (2006.01) |
| ***C23F 1/40*** | (2006.01) |
| ***H01L 51/00*** | (2006.01) |

(52) U.S. Cl.

CPC ............ *B32B 15/04* (2013.01); *C23C 14/042* (2013.01); *C23C 14/24* (2013.01); *C23C 14/34* (2013.01); *C23C 16/042* (2013.01); *C23F 1/16* (2013.01); *C23F 1/40* (2013.01); *H01L 51/0015* (2013.01); *B21B 2261/04* (2013.01)

(56) References Cited

U.S. PATENT DOCUMENTS

| | | | |
|---|---|---|---|
| 2003/0221613 | A1 | 12/2003 | Kang et al. |
| 2004/0018372 | A1 | 1/2004 | Komatsu et al. |
| 2004/0175633 | A1 | 9/2004 | Shoki et al. |
| 2004/0202821 | A1 | 10/2004 | Kim et al. |
| 2004/0224526 | A1 | 11/2004 | Shoki |
| 2006/0103289 | A1 | 5/2006 | Kim et al. |
| 2007/0072337 | A1 | 3/2007 | Matsuzaki et al. |
| 2008/0277157 | A1 | 11/2008 | Naito et al. |
| 2012/0019618 | A1 | 1/2012 | Lim et al. |
| 2013/0263749 | A1 | 10/2013 | Kernig et al. |
| 2014/0377903 | A1 | 12/2014 | Takeda et al. |
| 2016/0049586 | A1 | 2/2016 | Takeda et al. |
| 2016/0208392 | A1 | 7/2016 | Ikenaga et al. |
| 2016/0268511 | A1 | 9/2016 | Takeda et al. |
| 2016/0293844 | A1 | 10/2016 | Takeda et al. |
| 2017/0141315 | A1* | 5/2017 | Ikenaga ................. H05B 33/10 |
| 2017/0186955 | A1 | 6/2017 | Takeda et al. |
| 2018/0038002 | A1 | 2/2018 | Tamura et al. |
| 2018/0138410 | A1 | 5/2018 | Fujito et al. |

FOREIGN PATENT DOCUMENTS

| | | | |
|---|---|---|---|
| CN | 102851638 | A | 1/2013 |
| CN | 103205680 | A | 7/2013 |
| DE | 198 52 299 | A1 | 5/1999 |
| JP | H04-314535 | A | 11/1992 |
| JP | H05-290724 | A | 11/1993 |
| JP | H09-199812 | A | 7/1997 |
| JP | H09-209176 | A | 8/1997 |
| JP | H11-140667 | A | 5/1999 |
| JP | H11-260255 | A | 9/1999 |
| JP | 2002-151841 | A | 5/2002 |
| JP | 2002-219505 | A | 8/2002 |
| JP | 2002-246712 | A | 8/2002 |
| JP | 2004-276435 | A | 10/2004 |
| JP | 2005-076068 | A | 3/2005 |
| JP | 2006-233285 | A | 9/2006 |
| JP | 2007-095324 | A | 4/2007 |
| JP | 2008-41553 | A | 2/2008 |
| JP | 2009-052072 | A | 3/2009 |
| JP | 2009-127105 | A | 6/2009 |
| JP | 2010-214447 | A | 9/2010 |
| JP | 2011-166018 | A | 8/2011 |
| JP | 2012-087338 | A | 5/2012 |
| JP | 2012-243454 | A | 12/2012 |
| JP | 2013-209710 | A | 10/2013 |
| JP | 2013-542327 | A | 11/2013 |
| JP | 2013-245392 | A | 12/2013 |
| JP | 2014-101543 | A | 6/2014 |
| JP | 2014-133375 | A | 7/2014 |
| JP | 2014-148758 | A | 8/2014 |
| JP | 2014-208910 | A | 11/2014 |
| JP | 5641462 | B1 | 12/2014 |
| JP | 2015-052167 | A | 3/2015 |
| JP | 2015-055007 | A | 3/2015 |
| JP | 2015-117432 | A | 6/2015 |
| JP | 2015-127441 | A | 7/2015 |
| JP | 2015-129333 | A | 7/2015 |
| JP | 2015-129334 | A | 7/2015 |
| KR | 2003-0092790 | A | 12/2003 |
| WO | WO 2013/105643 | A1 | 7/2013 |
| WO | WO 2014/038510 | A1 | 3/2014 |

OTHER PUBLICATIONS

Non-Final Office Action dated Aug. 20, 2019, in U.S. Appl. No. 15/786,455, 19 pages.

Notification of Reasons for Refusal dated May 7, 2018, in Japanese Patent Application No. 2017-529473, 5 pages.

Notice of Reasons for Rejection dated Jan. 16, 2018, in Japanese Patent Application No. 2017-529473, 11 pages.

International Preliminary Report on Patentability dated Jan. 23, 2018, in International Patent Application No. PCT/JP2016/069350, 6 pages.

Office Action dated Feb. 26, 2018, in Taiwanese Patent Application No. 10720169960, 6 pages.

Office Action dated Mar. 2, 2018, in Chinese Patent Application No. 201680012997.X, 11 pages.

Office Action dated Mar. 15, 2018, in Chinese Patent Application No. 201680013003.6, 7 pages.

Second Office Action dated Sep. 23, 2019, in Chinese Patent Application No. 201610561108.7, 17 pages.

International Preliminary Report on Patentability dated Jan. 23, 2018, in International Patent Application No. PCT/JP2016/070951, with translation, 14 pages.

International Preliminary Report on Patentability dated Jan. 23, 2018, in International Patent Application No. PCT/JP2016/059041, with translation, 17 pages.

International Preliminary Report on Patentability dated Oct. 3, 2017, in International Patent Application No. PCT/JP2016/059401, with translation, 10 pages.

Non-Final Office Action dated Nov. 7, 2019, in U.S. Appl. No. 15/869,597, 24 pages.

Japanese Standards Association, *Definitions and Designation of Surface Roughness*, JIS B 0601: 1982, 20 pages.

Japanese Standards Association, *Geometrical Product Specifications (GPS)—Surface texture: Profile method—Terms, definitions and surface texture parameters*, JIS B 0601: 2001, 31 pages.

International Organization for Standardization, *Geometrical product specifications (GPS)—Surface texture: Areal*, ISO 25178-2:2012(E), pp. iv and 9.

Hishikawa et al., "Rolling Technology for Aluminum Sheet and Plate", Furukawa—Sky Review No. 4. Year:2008, English abstract included, 10 pages.

Third Party Observations filed with the German Patent and Trademark Office on Apr. 24, 2019, against German Patent Application No. DE 11 2016 003 225.0, 40 pages.

Tsukada and Kanada, "Evaluation of Two- and Three-Dimensional Surface Roughness Profiles and Their Confidence", Wear. 1986; 109: 69-78.

Non-Final Office Action dated Aug. 10, 2018 in U.S. Appl. No. 15/786,463, 8 pages.

Japanese Office Action, Notice of Reasons for Refusal, Japanese Patent Application No. 2019-127917, dated Aug. 25, 2020, with English Translation, 10 pages.

First Office Action for Chinese Patent Application No. 201811311762.8, dated Apr. 27, 2020, with English Translation, 26 pages.

(56) References Cited

OTHER PUBLICATIONS

Third Chinese Office Action, for Chinese Patent Application CN 201680041439.6, dated Oct. 19, 2020, with English Translation, 40 pages.
Mo Yunqi, "Research on Maunfacturing Process of COF Flexible Printed Baord for LCD and PCB Failure Analysis", University of Electronic Science and Technology of China, Chengdu China, English Abstract translation, 5 pages, Oct. 19, 2009.
Yoshida et al. "Evaluation Parameters of Surface Texture on Shot-Blasted Surfaces", Journal of the Japan Institute of Light Metals, English abstract with translation, 5 pages, vol. 61, No. 5 (May 31, 2011):187-191.
The Third Office Action for Chinese Patent Application No. 201610561108.7, dated Jun. 3, 2020, with English Translation, 42 pages.
Xu Qiangling, "Plating (Coating) Layer Quality Inspection Technology", with concise Explanation of Relevance, pp. 29-32, Jul. 1992.
Hui Wenhua et al. "Tribology and Wear Resistance Design", with concise Explanation of Relevance, pp. 488-489, Nov. 1993.
Notification of Reason for Refusal, issued by the Japanse Intellectual Property Office for Japanese Patent Application No. JP 2019-127917, dated Mar. 16, 2021, with translation, 8 pages.
Photofabrication Practical Introductory Reader (8th Edition) and Excerpt Korean Translation (Examination Reference Material No. 3), Jun. 2008, Japan Photofabrication Association, with partial English Translation, 26 pages.

* cited by examiner

METHOD FOR PRODUCING BASE FOR METAL MASKS, METHOD FOR PRODUCING METAL MASK FOR VAPOR DEPOSITION, BASE FOR METAL MASKS, AND METAL MASK FOR VAPOR DEPOSITION

BACKGROUND

The present disclosure relates to a method for manufacturing a metal mask substrate, a method for manufacturing a vapor deposition metal mask by use of a metal mask substrate, a metal mask substrate, and a vapor deposition metal mask.

Background Art

An organic EL display is known as one of the display devices manufactured according to a vapor deposition method. An organic layer included in the organic EL display is a deposit of organic molecules sublimed in a vapor deposition step. An opening of a metal mask used in the vapor deposition step is a passageway through which the sublimed organic molecules pass, and has a shape corresponding to the shape of pixels in the organic EL display (see Japanese Laid-Open Patent Publication No. 2015-055007, for example).

With the improvement of display quality in a display device or with the advancement of high definition of a display device, film formation by use of a metal mask is desired to realize high definition in the organic EL display or in a metal mask that determines a pixel size. In recent years, an organic EL display has been desired to realize high definition of 700 ppi or more, and therefore a metal mask capable of forming an organic layer in such a high-definition organic EL display has been desired.

The realization of high definition of film formation by use of a metal mask has been desired in the formation of wiring of various devices or been desired in vapor deposition by use of a metal mask of a functional layer or the like of various devices without being limited to the manufacturing of display devices including an organic EL display.

SUMMARY

It is an objective of the present disclosure to provide a method for manufacturing a metal mask substrate, a method for manufacturing a vapor deposition metal mask, a metal mask substrate, and a vapor deposition metal mask that are capable of realizing high definition of film formation by use of a vapor deposition metal mask.

To achieve the foregoing objective and in accordance with one aspect of the present disclosure, a method for manufacturing a metal mask substrate is provided. The method includes: preparing a rolled metal sheet, the rolled metal sheet including an obverse surface and a reverse surface that is a surface located opposite to the obverse surface, at least either one of the obverse surface and the reverse surface being an object to be processed; and reducing a thickness of the rolled metal sheet to 10 μm or less by etching the object to be processed by 3 μm or more by use of an acidic etching liquid, and roughening the object to be processed so that the processing object becomes a resist formation surface that has a surface roughness Rz of 0.2 μm or more, thereby obtaining a metal mask sheet.

To achieve the foregoing objective and in accordance with one aspect of the present disclosure, a method for manufacturing a vapor deposition metal mask is provided. The method includes: forming a metal mask substrate that includes at least one resist formation surface; forming a resist layer on the one resist formation surface; forming a resist mask by subjecting the resist layer to patterning; and etching the metal mask substrate by use of the resist mask. The metal mask substrate is formed by use of the above described method for manufacturing a metal mask substrate.

To achieve the foregoing objective and in accordance with one aspect of the present disclosure, a metal mask substrate is provided that includes a metal sheet that includes an obverse surface and a reverse surface located opposite to the obverse surface. At least either one of the obverse surface and the reverse surface is a resist formation surface. A thickness of the metal sheet is 10 μm or less. A surface roughness Rz of the resist formation surface is 0.2 μm or more.

To achieve the foregoing objective and in accordance with one aspect of the present disclosure, a vapor deposition metal mask that includes a metal mask substrate is provided. The metal mask substrate is the above-described metal mask substrate. The metal sheet included in the metal mask substrate has a plurality of through-holes that pass through between the obverse surface and the reverse surface.

With the aforementioned configuration, the thickness of the metal mask sheet is 10 μm or less, and it is thus possible to set the depth of a mask opening formed in the metal mask sheet at 10 μm or less. Therefore, it is possible to reduce a part that is hidden by the vapor deposition metal mask when a film-formation object is viewed from a deposited particle, i.e., it is possible to restrain a shadow effect. It is thus possible to obtain a shape conforming with the shape of a mask opening at the film-formation object, and, consequently, it is possible to realize high definition of film formation by use of the vapor deposition metal mask. Additionally, when a resist layer is formed on the resist formation surface in order to form a mask opening in the metal mask sheet, it is first possible to make adhesion between the resist layer and the metal mask substrate higher than before being roughened. Still additionally, it is possible to restrain the form accuracy from being reduced because of, for example, the peeling off of the resist layer from the metal mask sheet in the formation of the mask opening. In this respect, it is possible to realize high definition of film formation by use of the vapor deposition metal mask.

In the above-described method for manufacturing a metal mask substrate, the object to be processed may comprise both the obverse surface and the reverse surface.

With the aforementioned configuration, it is possible to form a resist layer on either resist formation surface, i.e., on either the resist formation surface formed from the obverse surface or the resist formation surface formed from the reverse surface. Therefore, it is possible to restrain adhesion between the resist layer and the metal mask substrate from becoming difficult to obtain because of mistaking the surface of an object on which the resist layer is formed. Consequently, it is possible to restrain the yield from being reduced when a vapor deposition metal mask is manufactured.

In the above-described method for manufacturing a metal mask substrate, the object to be processed is either the obverse surface or the reverse surface. The method further includes stacking a plastic support layer on a surface located opposite to the object to be processed. The object to be processed is etched in a state in which the rolled metal sheet and the support layer are stacked together, thereby obtaining a metal mask substrate, in which the metal mask sheet and the support layer are stacked together.

In the above-described method for manufacturing a metal mask substrate, the etching includes etching a first object to be processed that is either one of the obverse surface and the reverse surface and then etching a second object to be processed that is the remaining one of the obverse surface and the reverse surface. The method further includes etching the first object to be processed and then stacking a plastic support layer on the resist formation surface that has been obtained by etching the first object to be processed. The second object to be processed is etched in a state in which the rolled metal sheet and the support layer are stacked together, thereby obtaining a metal mask substrate in which the metal mask sheet and the support layer are stacked together.

With the aforementioned configuration, it is possible to reduce the complexity of handling of the metal mask sheet that results from the fragility of the metal mask sheet caused by the fact that the thickness of the metal mask sheet is 10 μm or less when the metal mask sheet is conveyed or when post-processing is applied to the metal mask sheet.

In the above-described method for manufacturing a metal mask substrate, the rolled metal sheet is preferably a rolled invar sheet, and the metal mask sheet is preferably an invar sheet.

With the aforementioned configuration, if the film-formation object is a glass substrate, the linear expansion coefficient of the glass substrate and the linear expansion coefficient of invar are substantially equal to each other. It is thus possible to apply a metal mask formed from the metal mask substrate to film formation on the glass substrate. That is, it is possible to apply a metal mask of which the form accuracy has been raised to film formation on the glass substrate.

In the above-described method for manufacturing a vapor deposition metal mask, the metal mask substrate preferably includes a laminate of the metal mask sheet and the plastic support layer. The method further includes chemically removing the support layer from the metal mask substrate by exposing, to alkaline solution, the metal mask substrate, in which the resist mask has been formed.

With the aforementioned configuration, an external force does not act on the metal mask sheet, and therefore the metal mask sheet is restrained from being rumpled or distorted in comparison with a case in which the support layer is physically peeled off from the metal mask sheet.

In the above-described metal mask substrate, the resist formation surface may have particle traces that are a plurality of hollows each of which is shaped like an elliptic cone, and major axes of the particle traces may be aligned.

The metal sheet is normally manufactured by rolling, and therefore there are not a few cases in which particles of, for example, oxides of a deoxidizer that is added during a process for manufacturing the metal sheet are mixed into the metal sheet. The particles that have been mixed into the obverse surface of the metal sheet are extended in the rolled direction of a metal material so as to be shaped like elliptic cones having the major axes aligned extending in the rolled direction. If such particles remain in a part in which a mask opening is formed in the resist formation surface, etching to form the mask opening may be hindered by the particles.

In this respect, with the aforementioned configuration, the resist formation surface has a plurality of particle traces shaped like elliptic cones with aligned major axes, respectively, i.e., the aforementioned particles have already been removed from the resist formation surface. Thus, when a mask opening is formed, it is also possible to make the form accuracy or size accuracy of the mask opening higher.

DESCRIPTION OF EXEMPLARY EMBODIMENTS

Referring to FIGS. 1 to 20, a description will be given of one embodiment in which a method for manufacturing a metal mask substrate, a method for manufacturing a vapor deposition metal mask, a metal mask substrate, and a vapor deposition metal mask are embodied. In the present embodiment, a vapor deposition metal mask that is used to form an organic layer of an organic EL device will be described as an example of a vapor deposition metal mask. Hereinafter, a configuration of a metal mask substrate, a method for manufacturing a vapor deposition metal mask including a method for manufacturing a metal mask substrate, and test examples will be described in this order.

Configuration of a Metal Mask Substrate

A configuration of a metal mask substrate will be described with reference to FIG. 1.

Figure 1:
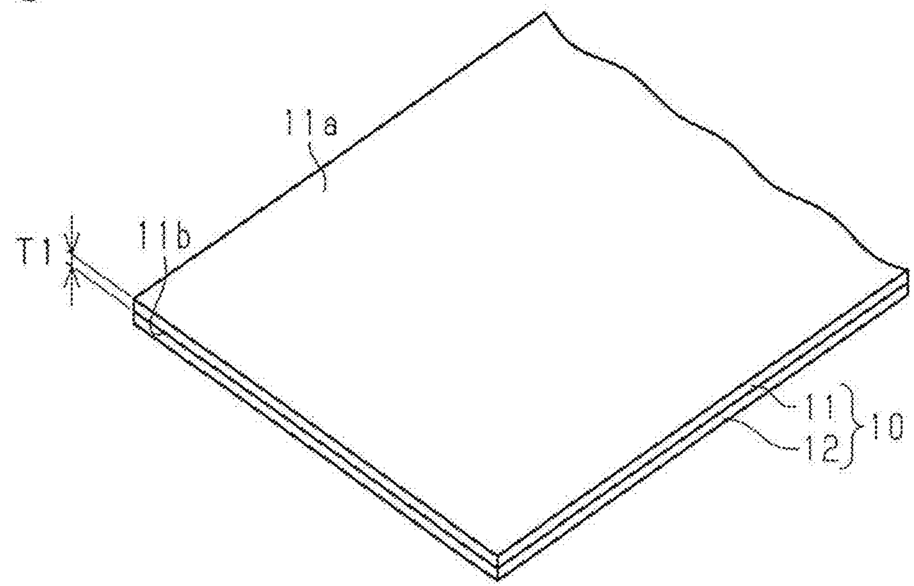
FIG. 1 is a perspective view showing a perspective structure of a metal mask substrate according to one embodiment of the present disclosure.

As shown in FIG. 1, a metal mask substrate 10 is an example of a metal mask sheet, and includes an invar sheet 11 that is an invar metal mask sheet. The invar sheet 11 is composed of an obverse surface 11*a* and a reverse surface 11*b* that is a surface on the side opposite to the obverse surface 11*a*. In the invar sheet 11, the obverse surface 11*a* and the reverse surface 11*b* are surfaces to be processed for resist, respectively, and are surfaces on each of which a resist layer can be formed when the invar sheet 11 is etched.

The thickness T1 of the invar sheet 11 is 10 μm or less, and the surface roughness Rz in the obverse surface 11*a* and the surface roughness Rz in the reverse surface 11*b* are each 0.2 μm or more.

The thickness of the invar sheet 11 is 10 μm or less, and it is thus possible to set the depth of a mask opening formed in the invar sheet 11 at 10 μm or less. Therefore, it is possible to reduce a part that is hidden by the vapor deposition metal mask when a film-formation object on which a film is formed is seen from a deposited particle, i.e., it is possible to restrain a shadow effect. It is thus possible to obtain a shape conforming with the shape of the mask opening in the film-formation object, and it is possible to realize high definition of film formation by use of the vapor deposition metal mask.

Additionally, when a resist layer is formed on the obverse surface 11*a* in order to form a mask opening in the invar sheet 11, it is first possible to make adhesion between the resist layer and the invar sheet 11 higher than before being roughened. Still additionally, it is possible to restrain form accuracy from being reduced because of, for example, the peeling off of the resist layer from the invar sheet 11 in the formation of the mask opening. Thus, in this respect also, it is possible to realize high definition of film formation by use of the vapor deposition metal mask.

The material of which the invar sheet 11 is made is a nickel-iron alloy that includes nickel of 36 mass % and iron, i.e., is invar, and the thermal expansion coefficient of the invar sheet 11 is about $1.2\times10^{-6}/°$ C.

The thermal expansion coefficient of the invar sheet 11 and the thermal expansion coefficient of a glass substrate that is an example of a film-formation object on which a film is formed are substantially equal to each other. Therefore, it is possible to apply a vapor deposition metal mask manufactured by use of the metal mask substrate 10 to film formation on the glass substrate, i.e., it is possible to apply a vapor deposition metal mask of which the form accuracy has been raised to film formation on the glass substrate.

The surface roughness Rz in the obverse surface of the invar sheet 11 is a value measured by a method conforming to JIS B 0601-2001. The surface roughness Rz is a maximum height in a contour curve that has a reference length.

The metal mask substrate 10 additionally includes a plastic support layer 12, and is a laminate consisting of the invar sheet 11 and the support layer 12. Among all parts of the invar sheet 11, the reverse surface 11*b* adheres closely to the support layer 12. The material that forms the support layer 12 is at least one of, for example, a polyimide and a negative resist. The support layer 12 may be a polyimide layer or may be a negative-resist layer. Alternatively, the support layer 12 may be a laminate consisting of a polyimide layer and a negative-resist layer.

Among these, the thermal expansion coefficient of a polyimide shows the same tendency as the thermal expansion coefficient of invar as temperature dependence, and is substantially equal in value to the thermal expansion coefficient of invar. Therefore, if the material forming the support layer 12 is a polyimide, it is possible to more reliably restrain the metal mask substrate 10 and the invar sheet 11 from being warped by a change in temperature in the metal mask substrate 10 than in a case in which the support layer 12 is made of plastic other than a polyimide.

Method for Manufacturing a Vapor Deposition Metal Mask

Referring to FIGS. 2 to 12, a description will be given of a method for manufacturing a vapor deposition metal mask.

Figure 2:
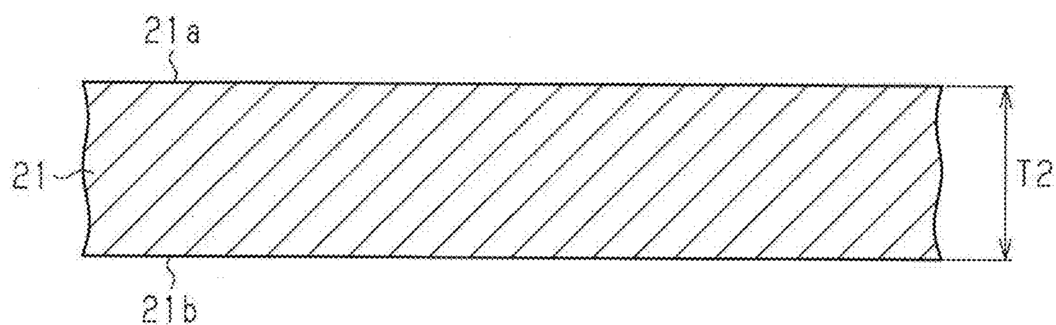
FIG. 2 is a process diagram showing a step of preparing a rolled invar sheet in a method for manufacturing a vapor deposition metal mask.

As shown in FIG. 2, the manufacturing method of a vapor deposition metal mask includes a method for manufacturing a metal mask substrate 10. In the manufacturing method of the metal mask substrate 10, a rolled invar sheet 21 that is an example of a rolled metal sheet is first prepared. The rolled invar sheet 21 is composed of an obverse surface 21*a* and a reverse surface 21*b* that is a surface on the side opposite to the obverse surface 21*a*, and, among all parts of the rolled invar sheet 21, the obverse surface 21*a* and the reverse surface 21*b* are objects to be processed, respectively, in the manufacturing method of the metal mask substrate 10.

The rolled invar sheet 21 is obtainable by rolling out an invar base material and by annealing the base material that has been rolled out. The surface roughness Rz of each of the obverse and reverse surfaces 21*a* and 21*b* of the rolled invar sheet 21 becomes smaller than the surface roughness Rz of each of the obverse and reverse surfaces of the base material in proportion to a reduction in the level difference of the obverse and reverse surfaces of the base material that is caused by rolling out the rolled invar sheet 21.

The thickness T2 of the rolled invar sheet 21 is, for example, 10 μm or more and 100 μm or less, and more preferably, 10 μm or more and 50 μm or less.

Figure 3:
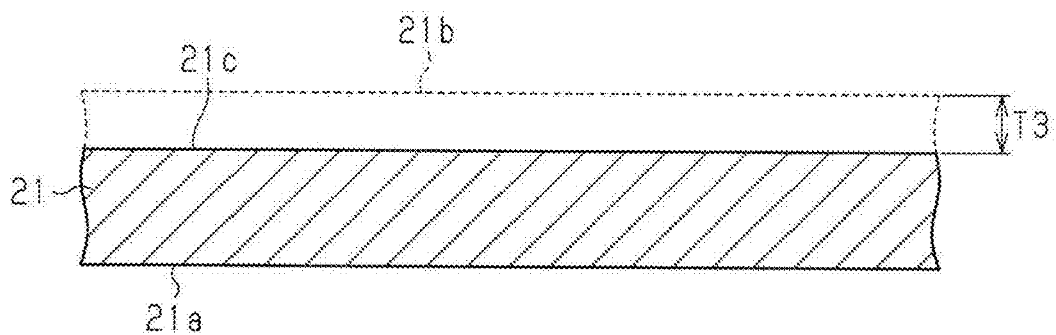
FIG. 3 is a process diagram showing a step of etching a reverse surface of a rolled invar sheet in the method for manufacturing a vapor deposition metal mask.

The reverse surface 21*b* is one object to be processed that is etched earlier in the two objects to be processed, and is an example of a first object to be processed. As shown in FIG. 3, the reverse surface 21*b* is etched with an acidic etching liquid by 3 μm or more. The difference between the reverse surface 21*b* of the rolled invar sheet 21 that has not yet been etched and the reverse surface of the rolled invar sheet 21 that has been etched, i.e., between the reverse surface 21*b* of the rolled invar sheet 21 that has not yet been etched and a resist formation surface 21*c* is an etching thickness T3. The etching thickness T3 is 3 μm or more.

The thickness of the rolled invar sheet 21 is made smaller by etching the reverse surface 21*b* than before etching the reverse surface 21*b*, and the reverse surface 21*b* is roughened so that the resist formation surface 21*c* has a surface roughness Rz of 0.2 μm or more.

The acidic etching liquid is recommended to be an etching liquid that is capable of etching invar, and is recommended to be solution having a composition that makes the reverse surface 21*b* of the rolled invar sheet 21 rougher than before the reverse surface 21*b* is etched. The acidic etching liquid is solution created by mixing any one of perchloric acid, hydrochloric acid, sulfuric acid, formic acid, and acetic acid, for example, with ferric perchlorate solution and with a mixture of ferric perchlorate solution and ferric chloride solution. The reverse surface 21*b* may be etched according to a dip way in which the rolled invar sheet 21 is dipped in an acidic etching liquid, or according to a spray way in which an acidic etching liquid is sprayed onto the reverse surface 21*b* of the rolled invar sheet 21, or according to a spin way in which an acidic etching liquid is dropped to the rolled invar sheet 21 rotated by a spinner.

The etching thickness T3 is recommended to be at least 3 μm, preferably 10 μm or more, and more preferably 15 μm or more.

Figure 4:
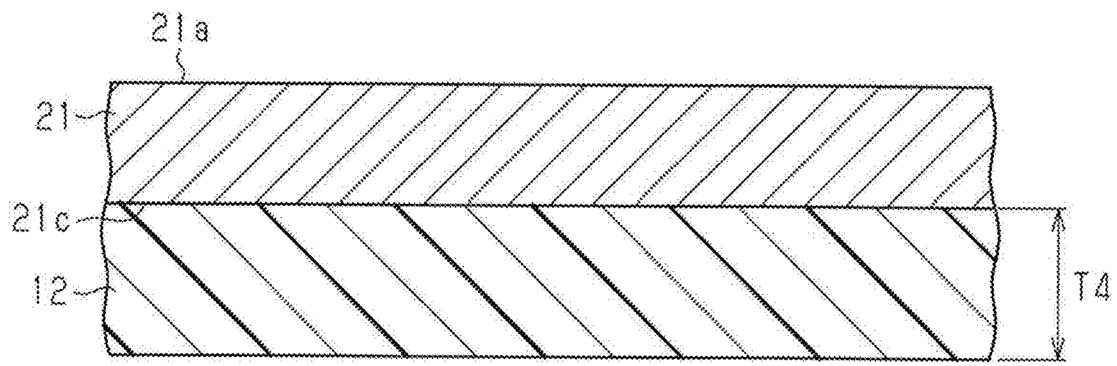
FIG. 4 is a process diagram showing a step of forming a support layer on a resist formation surface of a rolled invar sheet in the method for manufacturing a vapor deposition metal mask.

As shown in FIG. 4, the reverse surface 21*b* of the rolled invar sheet 21 is etched, and then the plastic support layer 12 is stacked on the resist formation surface 21*c*, which has been obtained by etching the reverse surface 21*b*. The thickness T4 of the support layer 12 is, for example, 10 μm or more and 50 μm or less.

Preferably, the thickness of the support layer 12 is 10 μm or more in the fact that the strength of a laminate consisting of the support layer 12 and the rolled invar sheet 21 is raised to such a degree as to reduce the complexity of handling that results from the fragility of the laminate in a process of manufacturing the metal mask substrate 10 even if the thickness of the rolled invar sheet 21 is 10 μm or less.

Additionally, preferably, the thickness of the support layer 12 is 50 μm or less in the fact that a period of time required when the support layer 12 is removed from the metal mask substrate 10 by means of alkaline solution is restrained from being excessively lengthened.

The support layer 12 may be stacked on the resist formation surface 21*c* by being bonded to the resist formation surface 21*c* after being formed into a sheet shape. Alternatively, the support layer 12 may be stacked on the resist formation surface 21*c* by applying an application liquid used to form the support layer 12 onto the resist formation surface 21*c*.

If the support layer 12 includes the aforementioned negative-resist layer, after a film of a negative resist is bonded to the resist formation surface 21*c* or after a negative resist is applied to the resist formation surface 21*c*, ultraviolet rays are radiated to the entire negative resist so as to form the support layer 12.

Figure 5:
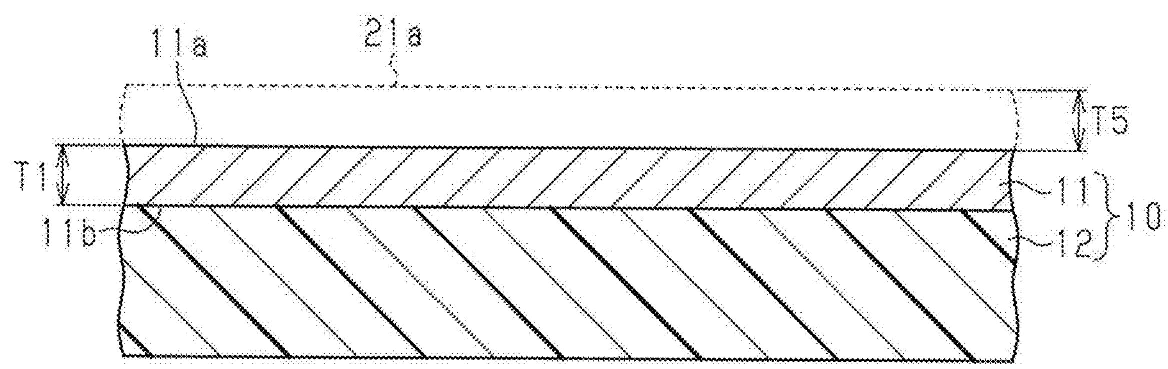
FIG. 5 is a process diagram showing a step of etching an obverse surface of the rolled invar sheet in the method for manufacturing a vapor deposition metal mask.

As shown in FIG. 5, in a state in which the rolled invar sheet 21 and the support layer 12 are stacked together, the obverse surface 21*a* of the rolled invar sheet 21, which is an example of a second object to be processed that is etched after the first object to be processed is etched, is etched with an acidic etching liquid by 3 μm or more. The difference between the obverse surface 21*a* of the rolled invar sheet 21 that has not yet been etched and the rolled invar sheet 21 that has been etched, i.e., between the obverse surface 21*a* of the rolled invar sheet 21 that has not yet been etched and the obverse surface 11*a* of the invar sheet 11 is an etching thickness T5. The etching thickness T5 is 3 μm or more.

As thus described, the etching of the rolled invar sheet 21 includes the fact that the reverse surface 21*b* of the rolled invar sheet 21 that is an example of the first object to be processed is etched and the fact that, thereafter, the obverse surface 21*a* that is an example of the second object to be processed is etched.

The thickness T2 of the rolled invar sheet 21 previously described with reference to FIG. 2 is set at 10 μm or less by etching the obverse surface 21*a*, and the obverse surface 21*a* is roughened so that the obverse surface 21*a* has a surface roughness Rz of 0.2 μm or more. This makes it possible to obtain the invar sheet 11 that is an example of a metal metal mask sheet and of a metal sheet and that has a surface roughness Rz of 0.2 μm or more in each of the obverse and reverse surfaces 11*a* and 11*b* and to obtain the metal mask substrate 10 in which the invar sheet 11 and the support layer 12 are stacked together.

Both the obverse surface 21*a* and the reverse surface 21*b* of the rolled invar sheet 21 are etched, and it is thus possible to form a resist layer on either resist formation surface, i.e., on either the resist formation surface formed from the obverse surface 21*a* or the resist formation surface 21*c* formed from the reverse surface 21*b*. Therefore, it is possible to restrain adhesion between the resist layer and the metal mask substrate 10 from becoming difficult to obtain because of mistaking the surface of an object on which a resist layer is formed, and, consequently, it is possible to restrain a yield from being reduced when a metal mask 51 for vapor deposition is manufactured.

The metal mask substrate 10 is a laminate consisting of the invar sheet 11 and the support layer 12. Therefore, it is possible to reduce the complexity of handling of the invar sheet 11 that results from the fragility of the invar sheet 11 caused by the fact that the thickness of the invar sheet 11 is 10 μm or less when the invar sheet 11 is conveyed or when post-processing is applied to the invar sheet 11.

The acidic etching liquid is recommended to be any one of the acidic etching liquids used to etch the reverse surface 21*b*, and, preferably, is the same as the acidic etching liquid used to etch the reverse surface 21*b*. Additionally, preferably, the obverse surface 21*a* is etched according to the same way as the reverse surface 21*b* is etched although the obverse surface 21*a* may be etched according to any one of the dip way, the spray way, and the spin way.

The etching thickness T5 is recommended to be at least 3 μm, and is preferably 10 μm or more, and is more preferably 15 μm or more. The etching thickness T5 and the aforementioned etching thickness T3 may be equal to each other, or may be different from each other.

Normally, when a base material of the rolled invar sheet 21 is formed, for example, granular aluminum, magnesium, or the like, which serves as a deoxidizer, is mixed with materials forming the base material in order to remove oxygen that has infiltrated into the materials forming the base material. Aluminum and magnesium are oxidized, and are included in the materials forming the base material in a state of metal oxides, such as an aluminum oxide and a magnesium oxide. When a base material is formed, some of the metal oxides are left inside the base material although most of the metal oxides are removed from the base material.

Figure 6:
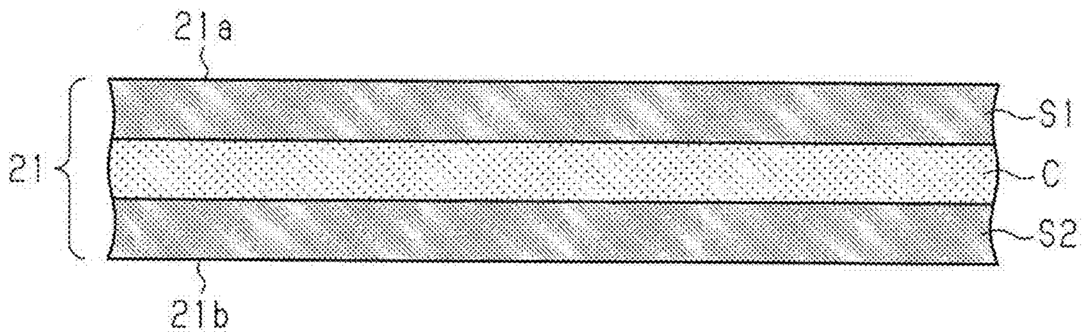
FIG. 6 is a schematic diagram that schematically shows the distribution of a metal oxide in the rolled invar sheet.

As shown in FIG. 6, among all parts of the rolled invar sheet 21, a part including the center in the thickness direction of the rolled invar sheet 21 is a central part C, and a part including the obverse surface 21*a* is a first surface layer part S1, and a part including the reverse surface 21*b* is a second surface layer part S2. The metal oxide is distributed at the first surface layer part S1 and at the second surface layer part S2 more than at the central part C.

The metal oxide is one cause that leads to the fact that a resist is peeled off from the invar sheet 11 or the fact that the invar sheet 11 is etched excessively when a vapor deposition metal mask is formed by etching the invar sheet 11.

As described above, in the manufacturing method of the metal mask substrate 10, the obverse surface 21*a* and the reverse surface 21*b* of the rolled invar sheet 21 are etched, and therefore at least a part of the first surface layer part S1 and at least one part of the second surface layer part S2 each of which includes more metal oxides are removed. Therefore, the resist is restrained from being peeled off because of the metal oxides, or the invar sheet 11 is restrained from being excessively etched because of the metal oxides, and the accuracy of etching with respect to the metal mask substrate 10 is restrained from becoming smaller than in a case in which the obverse surface 21*a* and the reverse surface 21*b* of the rolled invar sheet 21 are not etched.

Figure 7:
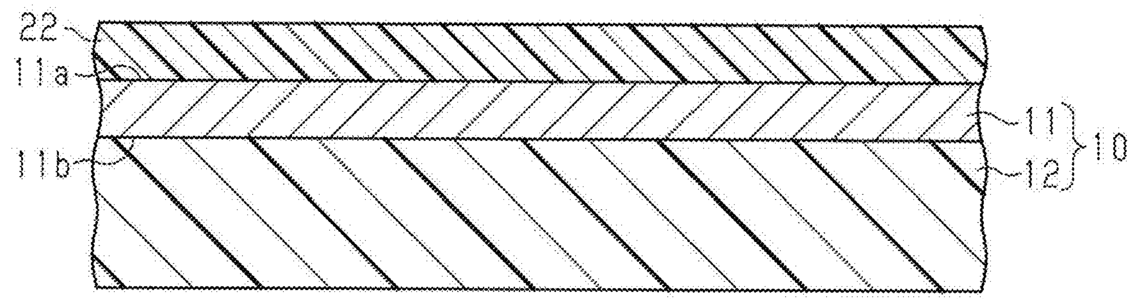
FIG. 7 is a process diagram showing a step of forming a resist layer in the method for manufacturing a vapor deposition metal mask.

As shown in FIG. 7, a resist layer 22 is formed on the obverse surface 11*a* of the invar sheet 11. The resist layer 22 may be formed on the obverse surface 11*a* by being formed in a sheet shape and then being bonded to the obverse surface 11*a*. Alternatively, the resist layer 22 may be formed on the obverse surface 11*a* by applying an application liquid that is used to form the resist layer 22 onto the obverse surface 11*a*.

The material forming the resist layer 22 may be a negative resist, or may be a positive resist. If the material forming the support layer 12 is a negative resist, it is preferable to form the resist layer 22 with the same material as the support layer 12.

Figure 8:
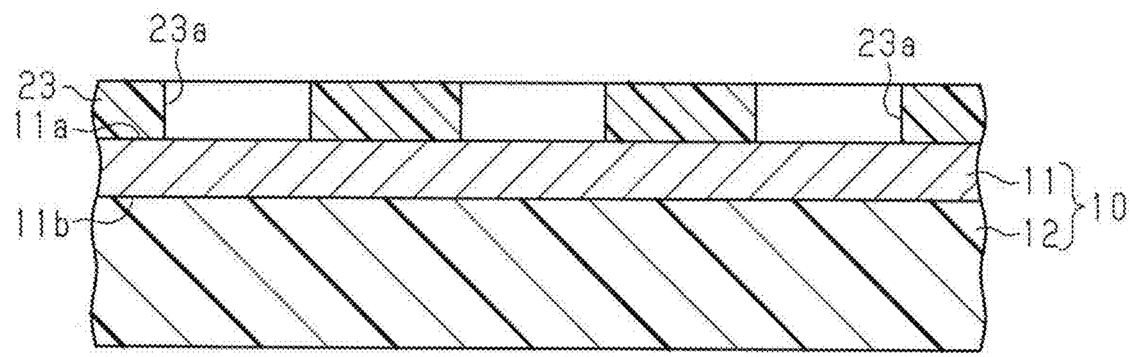
FIG. 8 is a process diagram showing a step of forming a resist mask in the method for manufacturing a vapor deposition metal mask.

As shown in FIG. 8, a resist mask 23 is formed by patterning the resist layer 22. The resist mask 23 has a plurality of through-holes 23*a* to etch the invar sheet 11.

If the material forming the resist layer 22 is a negative resist, ultraviolet rays are radiated onto parts other than a part corresponding to each through-hole 23*a* of the resist mask 23 among all parts of the resist layer 22, and the resist layer 22 is exposed. Thereafter, the resist mask 23 having the through-holes 23*a* is obtained by developing the resist layer 22 with a developer.

If the material forming the resist layer 22 is a positive resist, ultraviolet rays are radiated onto a part corresponding to each through-hole 23*a* of the resist mask 23 among all parts of the resist layer 22, and the resist layer 22 is exposed. Thereafter, the resist mask 23 having the through-holes 23*a* is obtained by developing the resist layer 22 with the developer.

Figure 9:
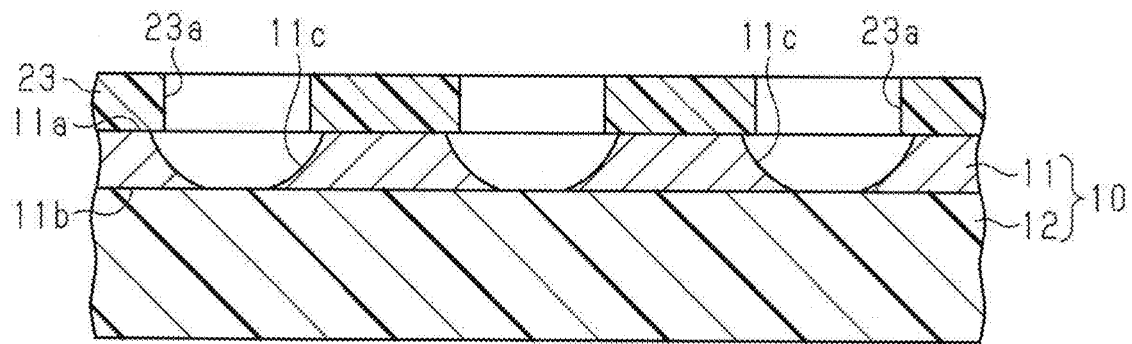
FIG. 9 is a process diagram showing a step of etching an invar sheet in the method for manufacturing a vapor deposition metal mask.

As shown in FIG. 9, the invar sheet 11 is etched by use of the resist mask 23. For example, ferric chloride solution is used to etch the invar sheet 11. By this ferric chloride solution, a plurality of through-holes 11*c* passing through the part between the obverse surface 11*a* and the reverse surface 11*b* are formed in the invar sheet 11, i.e., a mask opening is formed in the invar sheet 11. The inner peripheral surface of each through-hole 11*c* has the shape of a substantially inferior arc in a cross section along the thickness direction of the invar sheet 11, and the opening area in the obverse surface 11*a* is larger than the opening area in the reverse surface 11*b* in each through-hole 11*c*.

The thickness of the invar sheet 11 is 10 μm or less. Thus, as a result of merely etching the invar sheet 11 from the obverse surface 11*a*, it is possible to form a through-hole 11*c* that extends between the obverse surface 11*a* and the reverse surface 11*b* without excessively enlarging the mask opening of the invar sheet 11, i.e., without excessively enlarging the through-hole 11*c*.

Figure 10:
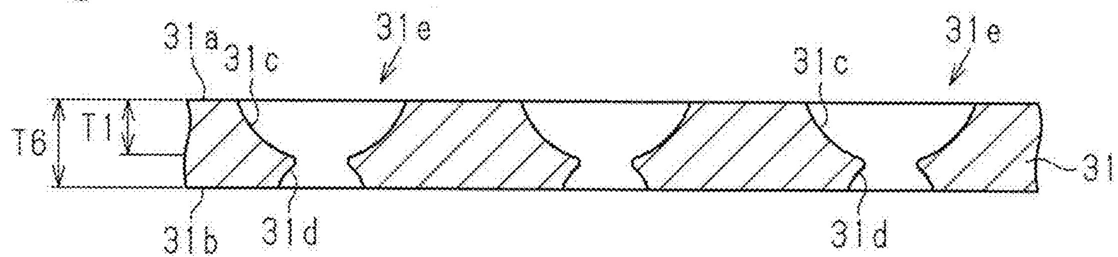
FIG. 10 is a cross-sectional view showing a sectional shape of a through-hole formed by etching both the obverse surface and the reverse surface of the invar sheet.

As shown in FIG. 10, the thickness T6 of an invar sheet 31 is greater than the thickness T1 of the invar sheet 11, i.e., the thickness T6 of the invar sheet 31 is greater than 10 μm. In this case, in order to form a through-hole that extends between an obverse surface 31*a* and a reverse surface 31*b* while setting the area of an opening in the obverse surface 31*a* of the invar sheet 31 so as to become substantially equal to the area of an opening in the obverse surface 11*a* of the invar sheet 11, it is necessary to etch the invar sheet 31 from the obverse surface 31*a* and from the reverse surface 31*b*.

As a result, a through-hole 31*e* is formed that is composed of a first hole 31*c* opened in the obverse surface 31*a* and a second hole 31*d* opened in the reverse surface 31*b*. In a direction perpendicular to the thickness of the invar sheet 31, the opening area of a connection portion between the first hole 31*c* and the second hole 31*d* is smaller than the opening area of the second hole 31*d* of the reverse surface 31*b*.

When the invar sheet 31 that has the thus configured through-hole 31*e* is used as a vapor deposition metal mask, the invar sheet 31 is disposed between a vapor deposition source and a film-formation object in a state in which the reverse surface 31*b* of the invar sheet 31 faces the film-formation object. The connection portion forms a part that is hidden by the vapor deposition metal mask among all parts of the invar sheet 31 when the film-formation object is viewed from a deposited particle. Correspondingly, a shape conforming with the shape of the mask opening in the second hole 31*d* is not obtained easily in the film-formation object. Therefore, it is preferable to make the depth of the second hole 31*d* small, i.e., to make the distance between the reverse surface 31*b* and the connection portion small.

In contrast, according to the through-hole 11*c* of the invar sheet 11, it is possible to, when the film-formation object is viewed from a deposited particle, make a part that is hidden by the vapor deposition metal mask smaller than the aforementioned invar sheet 31 correspondingly to the fact that the connection portion is not present. As a result, it is possible to obtain a shape further conforming with the shape of the mask opening in the film-formation object.

Figure 11:
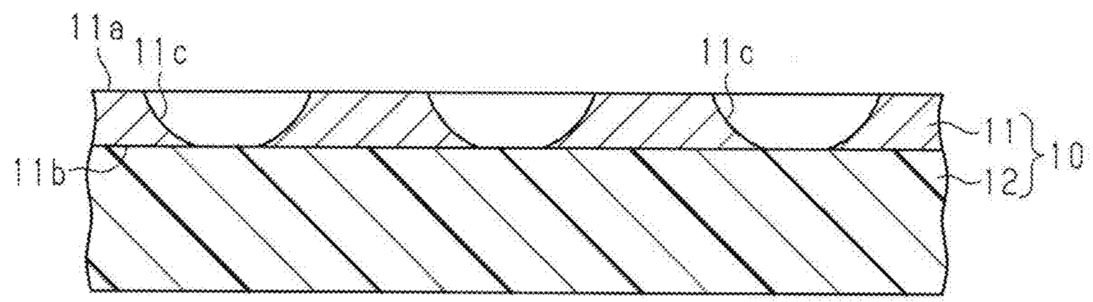
FIG. 11 is a process diagram showing a step of removing the resist mask in the method for manufacturing a vapor deposition metal mask.

As shown in FIG. 11, the resist mask 23, which is the resist mask 23 previously described with reference to FIG. 9 and which is located on the metal mask substrate 10, is removed. When the resist mask 23 is removed from the laminate consisting of the metal mask substrate 10 and the resist mask 23, a protective layer that protects the support layer 12 may be formed on a surface on the side opposite to a surface contiguous to the invar sheet 11 among all parts of the support layer 12. The protective layer restrains the support layer 12 from being dissolved by the solution that removes the resist mask 23.

Figure 12:
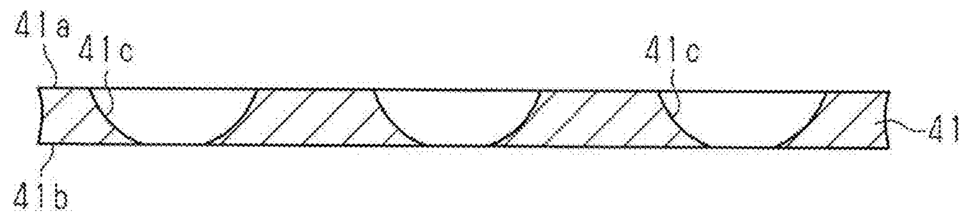
FIG. 12 is a process diagram showing a step of chemically removing the support layer in the method for manufacturing a vapor deposition metal mask.

As shown in FIG. 12, the resist mask 23 is removed, and then the metal mask substrate 10 is exposed to alkaline solution, and, as a result, the support layer 12 is chemically removed from the metal mask substrate 10. As a result, a metal mask sheet 41 for vapor deposition is obtained. The metal mask sheet 41 for vapor deposition has an obverse surface 41*a* corresponding to the obverse surface 11*a* of the invar sheet 11, a reverse surface 41*b* corresponding to the reverse surface 11*b* of the invar sheet 11, and a through-hole 41*c* corresponding to the through-hole 11*c* of the invar sheet 11.

At this time, the support layer 12 is chemically removed from the metal mask substrate 10, and therefore an external force does not act on the invar sheet 11, and the invar sheet 11 is restrained from being rumpled or distorted in comparison with a case in which the support layer 12 is physically peeled off from the invar sheet 11.

The alkaline solution is merely required to be solution capable of peeling off the support layer 12 from the invar sheet 11 by dissolving the support layer 12, and is, for example, sodium hydroxide aqueous solution. When the metal mask substrate 10 is exposed to alkaline solution, the metal mask substrate 10 may be immersed in the alkaline solution, or the alkaline solution may be sprayed onto the support layer 12 of the metal mask substrate 10, or the alkaline solution may be dropped to the support layer 12 of the metal mask substrate 10 being rotated by a spinner.

Figure 13:
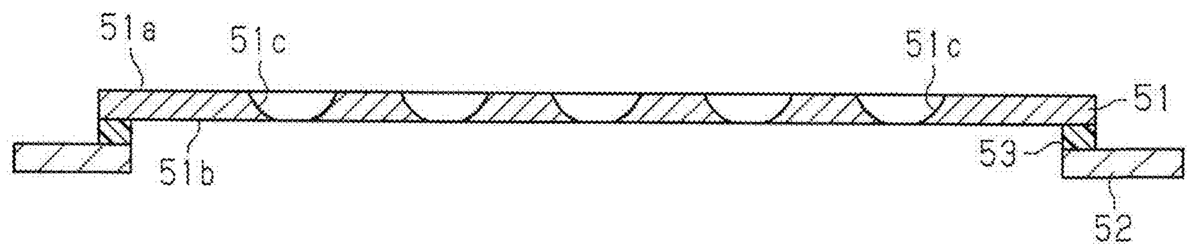
FIG. 13 is a cross-sectional view showing a cross-sectional structure of a vapor deposition metal mask bonded to a frame.

As shown in FIG. 13, a metal mask 51 for vapor deposition that has a predetermined length is cut out from the metal mask sheet 41 for vapor deposition. The metal mask 51 for vapor deposition has an obverse surface 51*a* corresponding to the obverse surface 41*a* of the metal mask sheet 41 for vapor deposition, a reverse surface 51*b* corresponding to the reverse surface 41*b* of the metal mask sheet 41 for vapor deposition, and a through-hole 51*c* corresponding to the through-hole 41*c* of the metal mask sheet 41 for vapor deposition.

Thereafter, when the vapor deposition of an organic layer is performed, the metal mask 51 for vapor deposition is bonded to the frame. In other words, the metal mask 51 for vapor deposition is used for the vapor deposition of the organic layer in a state of being bonded to a metal frame 52 by means of an adhesive layer 53. In the metal mask 51 for vapor deposition, a part of the reverse surface 51*b* of the metal mask 51 for vapor deposition faces a part of the frame 52, and the adhesive layer 53 is located between the metal mask 51 for vapor deposition and the frame 52. The metal mask 51 for vapor deposition may be bonded to the frame 52 by means of the adhesive layer 53 in a state in which a part of the obverse surface 51*a* of the metal mask 51 for vapor deposition faces a part of the frame 52 and in a state in which the adhesive layer 53 is located between the obverse surface 51*a* of the metal mask 51 for vapor deposition and the frame 52.

Figure 14:
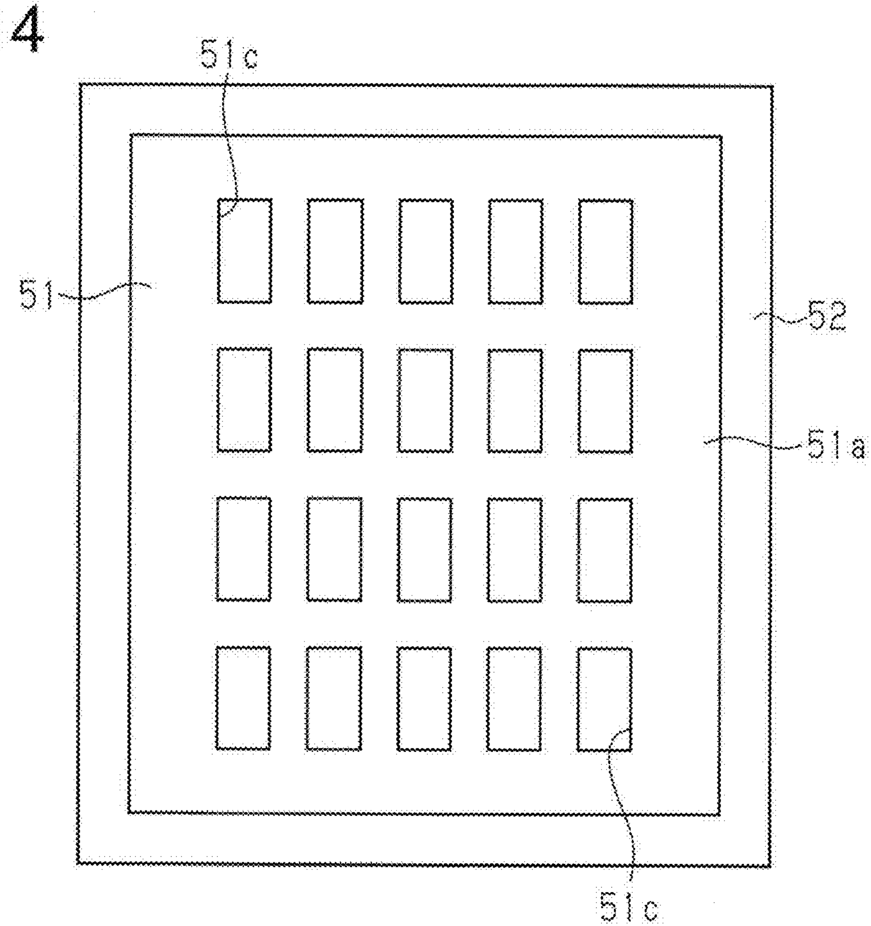
FIG. 14 is a plan view showing a plane structure of the vapor deposition metal mask bonded to the frame.

As shown in FIG. 14, in a plan view that faces the obverse surface 51*a* of the metal mask 51 for vapor deposition, the metal mask 51 for vapor deposition has a rectangular shape, and the frame 52 has a rectangular frame shape. In the plan view that faces the obverse surface 51*a*, each through-hole 51*c* has a rectangular shape. In other words, an opening in the obverse surface 51*a* among the through-holes 51*c* has a rectangular shape. Likewise, an opening in the reverse surface 51*b* among the through-holes 51*c* has a rectangular shape. The through-holes 51*c* are evenly spaced out in one direction, and are evenly spaced out in another direction perpendicular to the one direction. The metal mask 51 for vapor deposition is disposed between a vapor deposition source and a film-formation object in a state in which the reverse surface 51*b* of the metal mask 51 for vapor deposition faces the film-formation object.

In FIG. 14, the left-right direction in drawing is a direction in which pixels are arranged side by side in the film-formation object. Preferably, the distance between mutually adjoining through-holes 51*c* in the left-right direction is twice or more as wide as the width of the through-hole 51*c* in the left-right direction although the distance between the mutually adjoining through-holes 51*c* in the left-right direction is smaller than the width of the through-hole 51*c* in the left-right direction in FIG. 14.

TEST EXAMPLES

Test examples will be described with reference to FIGS. 15 to 20.

Test Example 1

A rolled invar sheet that had a thickness of 30 μm was prepared, and was set as a rolled invar sheet of Test Example 1.

Test Example 2

A rolled invar sheet that had a thickness of 30 μm was prepared, and the obverse surface of the rolled invar sheet was etched by 3 μm by spraying an acidic etching liquid onto the obverse surface of the rolled invar sheet, and an invar sheet of Test Example 2 that had a resist formation surface was obtained. Solution in which a perchloric acid is mixed with a mixture consisting of ferric perchlorate solution and ferric chloride solution was used as the acidic etching liquid.

Test Example 3

A rolled invar sheet that had a thickness of 30 μm was prepared, and the obverse surface of the rolled invar sheet was etched by 4.5 μm under the same condition as in Test Example 2, and an invar sheet of Test Example 3 that had a resist formation surface was obtained.

Test Example 4

A rolled invar sheet that had a thickness of 30 μm was prepared, and the obverse surface of the rolled invar sheet was etched by 10 μm under the same condition as in Test Example 2, and an invar sheet of Test Example 4 that had a resist formation surface was obtained.

Photographing of Obverse Surface by Scanning Electron Microscope

The obverse surface of Test Example 1 and the resist formation surface of each test example of from Test Example 2 to Test Example 4 were photographed by a scanning electron microscope, and SEM images were generated. The magnification of the scanning electron microscope (JSM-7001F made by JEOL Ltd.) was set at 10000 times, and the acceleration voltage was set at 10.0 kV, and the working distance was set at 9.7 mm.

Figure 15:
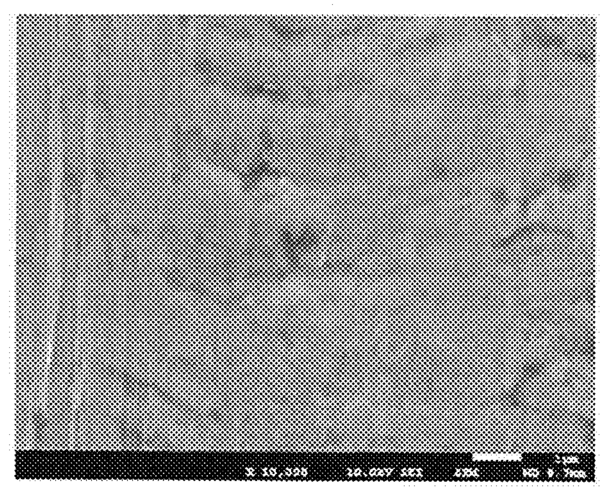
FIG. 15 is a SEM image obtained by photographing the obverse surface of a rolled invar sheet of Test Example 1.
Figure 16:
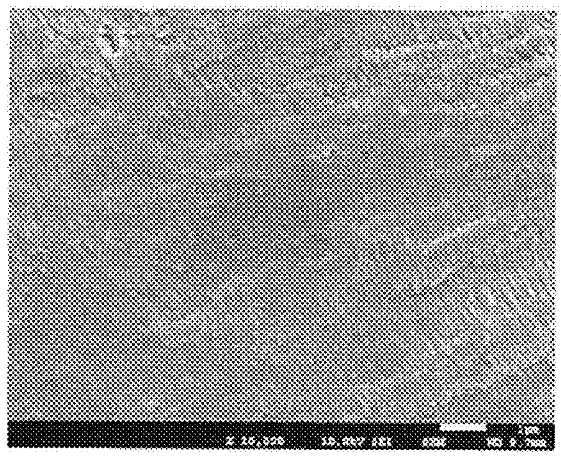
FIG. 16 is a SEM image obtained by photographing a resist formation surface of an invar sheet of Test Example 2.
Figure 17:
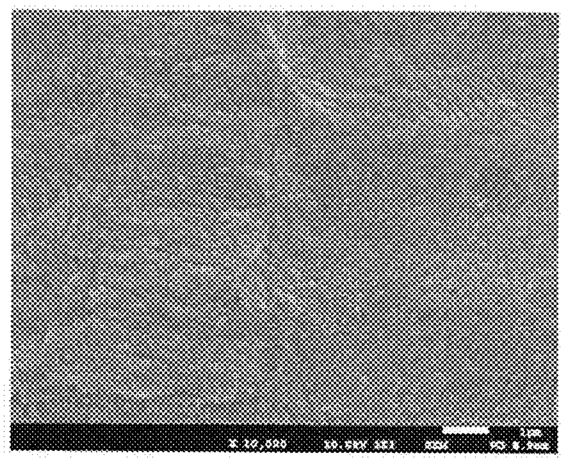
FIG. 17 is a SEM image obtained by photographing a resist formation surface of an invar sheet of Test Example 3.
Figure 18:
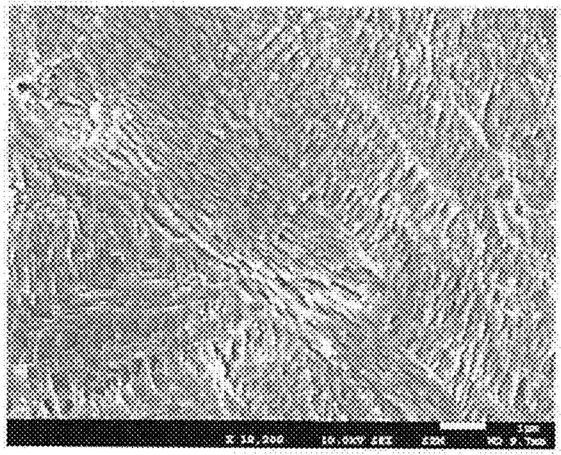
FIG. 18 is a SEM image obtained by photographing a resist formation surface of an invar sheet of Test Example 4.

As shown in FIG. 15, it was ascertained that the flatness of the obverse surface in the rolled invar sheet of Test Example 1 was the highest, and a rolled trace that was a streak extending in the up-down direction in the drawing was observed in the obverse surface in the rolled invar sheet of Test Example 1. As shown in FIGS. 16 and 17, it was ascertained that a level difference is formed in the resist formation surface in the invar sheet of Test Example 2 and in the resist formation surface in the invar sheet of Test Example 3. As shown in FIG. 18, it was ascertained that a larger level difference was formed in the resist formation surface in the invar sheet of Test Example 4 than in the resist formation surface in the invar sheet of Test Example 2 and in the resist formation surface in the invar sheet of Test Example 3. Additionally, it was ascertained that the rolled trace had substantially disappeared because of etching in the resist formation surface in each invar sheet of from FIGS. 16 to 18.

Measurement of Surface Roughness by Atomic Force Microscope

A test piece that included the obverse surface in the rolled invar sheet of Test Example 1 as an obverse surface was created, and a test piece that included the resist formation surface of the invar sheet in each test example of from Test Example 2 to Test Example 4 as an obverse surface was created. Thereafter, the surface roughness in a scan region that was a region having a square shape in which the length of a side is 5 μm was measured in the obverse surface of each test piece.

The surface roughness in the obverse surface of each test example was measured according to a method conforming to JIS B 0601-2001 by use of an atomic force microscope (AFM5400L made by Hitachi High-Tech Science Corporation). Measurement results of the surface roughness were as shown in Table 1 below. Additionally, based on the measurement results, the surface area ratio in each test piece was calculated as the ratio of a surface area in a scan region with respect to an area of the scan region. In other words, the surface area ratio was a value obtained by dividing the surface area in the scan region by the area of the scan region.

Among parameters of the surface roughness shown in Table 1, Rz designates a maximum height that is the sum of the height of the highest crest and the depth of the deepest trough in a contour curve that has a reference length, and Ra designates the arithmetic mean roughness of a contour curve that has a reference length. Rp designates the height of the highest crest in a contour curve that has a reference length, and Rv designates the depth of the deepest trough in a contour curve that has a reference length. In the following description, each unit of Rz, Ra, Rp, and Rv is μm.

TABLE 1

| | Etching thickness (μm) | Rz | Ra | Rp | Rv | Surface area ratio |
|---|---|---|---|---|---|---|
| Test Example 1 | 0 | 0.17 | 0.02 | 0.08 | 0.09 | 1.02 |
| Test Example 2 | 3 | 0.24 | 0.02 | 0.12 | 0.12 | 1.23 |
| Test Example 3 | 4.5 | 0.28 | 0.03 | 0.15 | 0.13 | 1.13 |
| Test Example 4 | 10 | 0.30 | 0.03 | 0.17 | 0.13 | 1.22 |

As shown in Table 1, in the obverse surface in the rolled invar sheet of Test Example 1, it was ascertained that the surface roughness Rz was 0.17, the surface roughness Ra was 0.02, the surface roughness Rp was 0.08, and the surface roughness Rv was 0.09. Additionally, in the obverse surface in the rolled invar sheet of Test Example 1, it was ascertained that the surface area ratio was 1.02.

In the resist formation surface in the invar sheet of Test Example 2, it was ascertained that the surface roughness Rz was 0.24, the surface roughness Ra was 0.02, the surface roughness Rp was 0.12, and the surface roughness Rv was 0.12. Additionally, in the resist formation surface in the invar sheet of Test Example 2, it was ascertained that the surface area ratio was 1.23.

In the resist formation surface in the invar sheet of Test Example 3, it was ascertained that the surface roughness Rz was 0.28, the surface roughness Ra was 0.03, the surface roughness Rp was 0.15, and the surface roughness Rv was 0.13. Additionally, in the resist formation surface in the invar sheet of Test Example 3, it was ascertained that the surface area ratio was 1.13.

In the resist formation surface in the invar sheet of Test Example 4, it was ascertained that the surface roughness Rz was 0.30, the surface roughness Ra was 0.03, the surface roughness Rp was 0.17, and the surface roughness Rv was 0.13. Additionally, in the resist formation surface in the invar sheet of Test Example 4, it was ascertained that surface area ratio was 1.22.

As thus described, in the invar sheet obtained by etching the obverse surface of the rolled invar sheet by 3 μm or more, it was ascertained that the surface roughness Rz in the resist formation surface was 0.2 μm or more. Additionally, from the fact that surface roughness Rz in the resist formation surface became larger in proportion to an increase in etching thickness, it was ascertained that the etching thickness in the obverse surface of the rolled invar sheet was preferably 4.5 μm, and more preferably 10 μm.

A rolled invar sheet that had a thickness of 30 μm was prepared, and an invar sheet that had a thickness of 10 μm was obtained by etching each of the obverse and reverse surfaces of the rolled invar sheet by 10 μm under the aforementioned conditions. At this time, a polyimide sheet that had a thickness of 20 μm and that served as a support layer was bonded to the resist formation surface obtained from the reverse surface of the rolled invar sheet.

It has been ascertained by the present inventors that it is possible to, with the thus configured invar sheet, form a through-hole that extends between the obverse surface and the reverse surface of the invar sheet merely by etching the invar sheet from the obverse surface of the invar sheet. Additionally, it has been ascertained by the present inventors that, in the thus configured through-hole, the opening area in the obverse surface of the invar sheet and the opening area in the reverse surface of the invar sheet each have a desired extent.

Additionally, a dry film resist was bonded to the obverse surface of the rolled invar sheet of Test Example 1, and was subjected to patterning, and then the rolled invar sheet of Test Example 1 was etched so as to form a plurality of concave portions on the obverse surface.

Thereafter, a dry film resist was bonded to the resist formation surface of each invar sheet of Test Examples 2 to 4, and was subjected to patterning, and then each invar sheet of Test Examples 2 to 4 was etched so as to form a plurality of concave portions on the resist formation surface. In Test Examples 2 to 4, the same method as in Test Example 1 was employed as the patterning method of the dry film resist, and the etching conditions of the invar sheet were set to be the same as in Test Example 1.

In each of Test Examples 2 to 4, it was ascertained that variations in the size of the opening in the resist formation surface were smaller than variations in the size of the opening in Test Example 1. In other words, it was ascertained that, if the surface roughness Rz was 0.2 μm or more as in each of Test Examples 2 to 4, adhesion between the resist layer and the invar sheet was heightened, and, as a result, the form accuracy in the mask opening was restrained from being lowered.

Test Example 5

A rolled invar sheet that had a thickness of 30 μm was prepared, and was set as a rolled invar sheet of Test Example 5.

Test Example 6

A rolled invar sheet that had a thickness of 30 μm was prepared, and the obverse surface of the rolled invar sheet was etched by 3 μm under the same conditions as in Test Example 2, and an invar sheet of Test Example 6 that had a resist formation surface was obtained.

Test Example 7

A rolled invar sheet that had a thickness of 30 μm was prepared, and the obverse surface of the rolled invar sheet was etched by 10 μm under the same conditions as in Test Example 2, and an invar sheet of Test Example 7 that had a resist formation surface was obtained.

Test Example 8

A rolled invar sheet that had a thickness of 30 μm was prepared, and the obverse surface of the rolled invar sheet was etched by 15 μm under the same conditions as in Test Example 2, and an invar sheet of Test Example 8 that had a resist formation surface was obtained.

Test Example 9

A rolled invar sheet that had a thickness of 30 μm was prepared, and the obverse surface of the rolled invar sheet was etched by 16 μm under the same conditions as in Test Example 2, and an invar sheet of Test Example 9 that had a resist formation surface was obtained.

Counting of Particle Traces

Three test pieces were created each of which included a part of the obverse surface in the rolled invar sheet of Test Example 5 as its obverse surface and each of which had a square shape having a side length of 2 mm. Furthermore, three test pieces were created each of which included a part of the resist formation surface in each invar sheet of Test Examples 6 to 9 as its obverse surface and each of which had a square shape having a side length of 2 mm.

The obverse surface of each test piece was observed by use of the scanning electron microscope (same as above), and the number of particle traces of each test piece was counted. The particle trace is a trace that appears from the fact that a particle of a metal oxide has been eliminated from a rolled invar sheet or from an invar sheet. In each test piece, at least either one of a first particle trace and a second particle trace was observed. Results obtained by counting the number of particle traces were as shown in Table 2 below.

Figure 19:
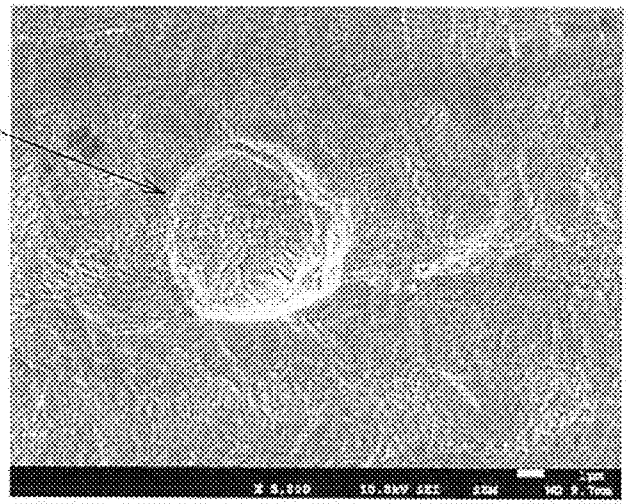
FIG. 19 is a SEM image obtained by photographing a first particle trace.

As shown in FIG. 19, the first particle trace defined a substantially circular region in a plan view facing the obverse surface of a test piece, and was a hollow that had a hemispherical shape. It was ascertained that the diameter of the first particle trace was 3 μm or more and 5 μm or less.

Figure 20:
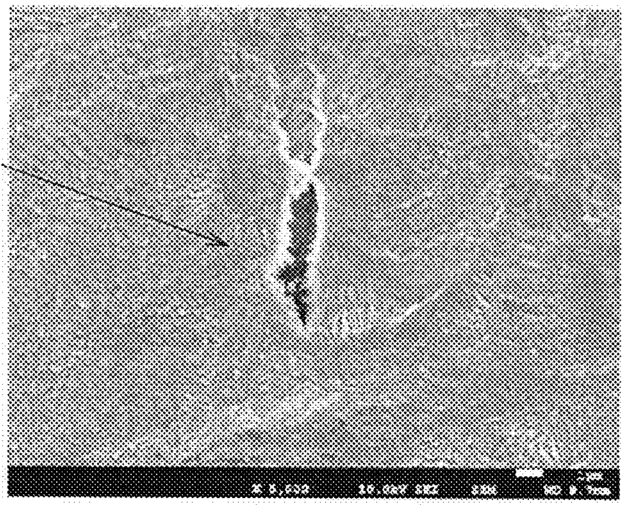
FIG. 20 is a SEM image obtained by photographing a second particle trace.

In contrast, as shown in FIG. 20, the second particle trace defined a substantially elliptical region in a plan view facing the obverse surface of a test piece, and was a hollow that was shaped as an elliptic cone. It was ascertained that the major axis of the second particle trace was 3 μm or more and 5 μm or less.

When the first particle trace and the second particle trace were photographed, the magnification was set at 5000 times, the acceleration voltage was set at 10.0 kV, and the working distance was set at 9.7 mm in the scanning electron microscope.

TABLE 2

| | Etching thickness (μm) | Test piece No. | First particle trace (number of traces) | Second particle trace (number of traces) | Total (number of traces) First particle trace | Total (number of traces) Second particle trace |
|---|---|---|---|---|---|---|
| Test Example 5 | 0 | Test piece 1 | 1 | 0 | 1 | 0 |
| | | Test piece 2 | 0 | 0 | | |
| | | Test piece 3 | 0 | 0 | | |
| Test Example 6 | 3 | Test piece 1 | 4 | 1 | 21 | 3 |
| | | Test piece 2 | 9 | 0 | | |
| | | Test piece 3 | 8 | 2 | | |
| Test Example 7 | 10 | Test piece 1 | 5 | 1 | 16 | 4 |
| | | Test piece 2 | 6 | 1 | | |
| | | Test piece 3 | 5 | 2 | | |
| Test Example 8 | 15 | Test piece 1 | 5 | 0 | 13 | 1 |
| | | Test piece 2 | 2 | 0 | | |
| | | Test piece 3 | 6 | 1 | | |
| Test Example 9 | 16 | Test piece 1 | 4 | 0 | 14 | 0 |
| | | Test piece 2 | 5 | 0 | | |
| | | Test piece 3 | 5 | 0 | | |

As shown in Table 2, in Test Example 5, it was ascertained that test piece 1 had a single first particle trace, and it was ascertained that both test piece 2 and test piece 3 had no particle traces. In other words, in Test Example 5, it was ascertained that the total of first particle traces was one, and the total of second particle traces was zero.

In Test Example 6, it was ascertained that test piece 1 had four first particle traces and one second particle trace, and test piece 2 had nine first particle traces, and test piece 3 had eight first particle traces and two second particle traces. In other words, in Test Example 6, it was ascertained that the total of first particle traces was twenty-one, and the total of second particle traces was three.

In Test Example 7, it was ascertained that test piece 1 had five first particle traces and one second particle trace, and test piece 2 had six first particle traces and one second particle trace, and test piece 3 had five first particle traces and two second particle traces. In other words, in Test Example 7, it was ascertained that the total of first particle traces was sixteen, and the total of second particle traces was four.

In Test Example 8, it was ascertained that test piece 1 had five first particle traces, and test piece 2 had two first particle traces, and test piece 3 had six first particle traces and one second particle trace. In other words, in Test Example 8, it was ascertained that the total of first particle traces was thirteen, and the total of second particle traces was one.

In Test Example 9, it was ascertained that test piece 1 has four first particle traces, and test piece 2 had five first particle traces, and test piece 3 had five first particle traces, while all of test piece 1 to test piece 3 had no second particle traces. In other words, in Test Example 9, it was ascertained that the total of first particle traces was fourteen.

In Test Example 6 and Test Example 7 each of which had a plurality of second particle traces, it was ascertained that major axes in second particle traces were uniform, and the major axis direction was parallel to the rolled direction of a rolled invar sheet to form an invar sheet.

As thus described, it was ascertained that it was possible to exclude second particle traces from the resist formation surface of the invar sheet if the obverse surface of the rolled invar sheet was etched by 16 μm or more. Additionally, it was ascertained that it was possible to reduce the number of first particle traces by etching the obverse surface of the rolled invar sheet by 10 μm or more, and it was ascertained that it was possible to further reduce the number of first particle traces by etching the obverse surface of the rolled invar sheet by 15 μm or more.

From these results, it can be said that it is possible to reduce particles of a metal oxide in the rolled invar sheet by etching the obverse surface of the rolled invar sheet by 10 μm or more, and more preferably by etching the obverse surface of the rolled invar sheet by 15 μm or more. Therefore, it can be said that it is effective to etch the obverse surface of the rolled invar sheet by 10 μm or more, and more preferably etch the obverse surface of the rolled invar sheet by 15 μm or more in order to restrain the elimination of a metal oxide from affecting the form accuracy of a through-hole formed by etching a metal mask substrate.

As described above, it is possible to obtain advantages mentioned below according to one embodiment of a method for manufacturing a metal mask substrate, of a method for manufacturing a vapor deposition metal mask, of a metal mask substrate, and of a vapor deposition metal mask.

(1) The thickness of the invar sheet 11 is 10 μm or less, and it is thus possible to set the depth of a mask opening formed in the invar sheet 11 at 10 μm or less. Therefore, it is possible to reduce a part that is hidden by the metal mask 51 for vapor deposition when a film-formation object is viewed from a deposited particle, i.e., it is possible to restrain a shadow effect, and it is thus possible to obtain a shape conforming with the shape of a mask opening at the film-formation object, and, consequently, it is possible to realize high definition of film formation by use of the metal mask 51 for vapor deposition.

Additionally, when a mask opening is formed in the invar sheet 11, it is possible to make adhesion between the resist layer 22 and the invar sheet 11 higher than before being roughened. Still additionally, it is possible to restrain form accuracy from being reduced because of, for example, the peeling off of the resist layer 22 from the invar sheet 11 in the formation of the mask opening. In this respect, it is possible to realize high definition of film formation by use of the metal mask 51 for vapor deposition.

(2) It is possible to form a resist layer 22 on either resist formation surface, i.e., on either the resist formation surface formed from the obverse surface 21*a* of the rolled invar sheet 21 or the resist formation surface 21*c* formed from the reverse surface 21*b* of the rolled invar sheet 21. Therefore, it is possible to restrain adhesion between the resist layer 22 and the metal mask substrate 10 from becoming difficult to obtain because of mistaking the surface of an object on which the resist layer 22 is formed, and, consequently, it is possible to restrain a yield from being reduced when a metal mask 51 for vapor deposition is manufactured.

(3) It is possible to reduce the complexity of handling of the invar sheet 11 that results from the fragility of the invar sheet 11 caused by the fact that the thickness of the invar sheet 11 is 10 μm or less when the invar sheet 11 is conveyed or when post-processing is applied to the invar sheet 11.

(4) An external force does not act on the invar sheet 11, and therefore the invar sheet 11 is restrained from being rumpled or distorted in comparison with a case in which the support layer 12 is physically peeled off from the invar sheet 11.

The above-described embodiment may be modified as follows.

The support layer 12 may be physically peeled off from the invar sheet 11. In other words, an external force may be applied onto at least either one of the support layer 12 and the invar sheet 11 so that peeling-off occurs in an interface between the support layer 12 and the invar sheet 11. Even in the thus configured configuration, it is possible to obtain an advantage equivalent to the aforementioned advantage (1) by performing a roughening operation so that the surface roughness Rz of the resist formation surface becomes 0.2 μm or more and by etching the rolled invar sheet 21 so that the thickness in the rolled invar sheet 21 that has been etched becomes 10 μm or less.

It is preferable to chemically remove the support layer 12 from the metal mask substrate 10 by use of alkaline solution in order to restrain the invar sheet 11 from being rumpled or distorted as described above.

When the obverse surface 21*a* and the reverse surface 21*b* of the rolled invar sheet 21 are etched, the reverse surface 21*b* may be etched earlier than the obverse surface 21*a*, or the obverse surface 21*a* and the reverse surface 21*b* may be simultaneously etched. It is possible to obtain an advantage equivalent to the aforementioned advantage (1) by performing a roughening operation so that the surface roughness Rz of the resist formation surface becomes 0.2 μm or more and by etching the rolled invar sheet 21 so that the thickness in the rolled invar sheet 21 that has been etched becomes 10 μm or less regardless of order in which the obverse surface 21*a* and the reverse surface 21*b* are etched.

An object to be processed in the rolled invar sheet 21 may be only the obverse surface 21*a* of the rolled invar sheet 21, or may be only the reverse surface 21*b* of the rolled invar sheet 21. Even in the thus configured configuration, it is possible to obtain an advantage equivalent to the aforementioned advantage (1) by performing a roughening operation so that the surface roughness Rz of the resist formation surface becomes 0.2 μm or more and by etching the rolled invar sheet 21 so that the thickness in the rolled invar sheet 21 that has been etched becomes 10 μm or less.

If the object to be processed is only the obverse surface 21*a* in the rolled invar sheet 21, it is preferable to stack the support layer 12 on the reverse surface 21*b* before etching the obverse surface 21*a* and then etch the obverse surface 21*a* in a state in which the rolled invar sheet 21 and the support layer 12 are stacked together. If the object to be processed is only the reverse surface 21*b*, it is preferable to form the support layer 12 on the obverse surface 21*a* before etching the reverse surface 21*b* and then etch the reverse surface 21*b* in a state in which the rolled invar sheet 21 and the support layer 12 are stacked together. Likewise, this configuration makes it possible to obtain an advantage equivalent to the aforementioned advantage (3).

Even if the object to be processed is either the obverse surface 21*a* or the reverse surface 21*b* or even if the object to be processed is both the obverse surface 21*a* and the reverse surface 21*b*, the object to be processed in the rolled invar sheet 21 may be etched in a state in which the support layer 12 is not formed at the rolled invar sheet 21. Even in the thus configured configuration, it is possible to obtain an advantage equivalent to the aforementioned advantage (1) by performing a roughening operation so that the surface roughness Rz of the resist formation surface becomes 0.2 μm or more and by etching the rolled invar sheet 21 so that the thickness in the rolled invar sheet 21 that has been etched becomes 10 μm or less.

In this case, the metal mask substrate may be arranged so as not to have the support layer 12, i.e., may be arranged so as to include only the invar sheet 11. Alternatively, the metal mask substrate that is a laminate consisting of the invar sheet 11 and the support layer 12 may be obtained by obtaining the invar sheet 11 from the rolled invar sheet 21 and then stacking the support layer 12 on one surface of the invar sheet 11.

Figure 21:
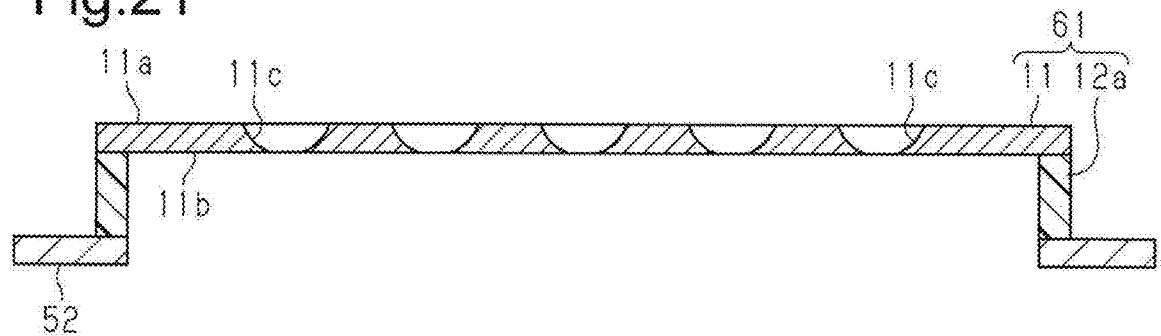
FIG. 21 is a cross-sectional view showing a cross-sectional structure between a metal mask and a frame in a modification.

As shown in FIG. 21, if the material forming the support layer 12 is polyimide, when the support layer 12 is removed from the metal mask substrate 10, only a part that overlaps with the through-hole 11*c* of the invar sheet 11 in the thickness direction of the metal mask substrate 10 among all parts of the support layer 12 may be removed from the invar sheet 11. In other words, when the support layer 12 is removed from the metal mask substrate 10, only a part that is an edge part of the support layer 12 and that is a part other than parts positioned outside all through-holes 11*c* among all parts of the support layer 12 may be removed in a plan view facing the reverse surface 11*b* of the invar sheet 11.

In the thus configured configuration, a metal mask 61 for vapor deposition is composed of the invar sheet 11 and a polyimide frame 12*a* having a rectangular frame shape. The invar sheet 11 has a plurality of through-holes 11*c*, and the polyimide frame 12*a* has a rectangular frame shape and surrounds all through-holes 11*c* in a plan view facing the reverse surface 11*b* of the invar sheet 11.

The polyimide frame 12*a* of the metal mask 61 for vapor deposition can function as an adhesive layer when the metal mask 61 for vapor deposition is attached to the frame 52. Therefore, the metal mask 61 for vapor deposition is attached to the frame 52 in a state in which the polyimide frame 12*a* among all parts of the metal mask 61 for vapor deposition is in contact with the frame 52.

Figure 22:
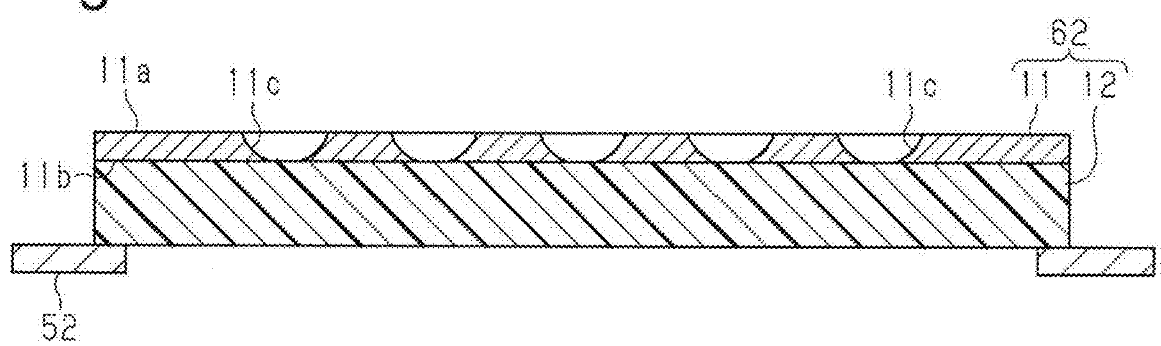
FIG. 22 is a cross-sectional view showing a cross-sectional structure between a metal mask and a frame in a modification.

As shown in FIG. 22, if the material forming the support layer 12 is polyimide, the support layer 12 is not required to be removed from the metal mask substrate 10. In the thus configured configuration, a metal mask 62 for vapor deposition is composed of the invar sheet 11 having the through-holes 11*c* and the support layer 12 overlapping with the entire reverse surface 11*b* of the invar sheet 11 at a point when the metal mask 62 for vapor deposition is bonded to the frame 52.

In the same way as the polyimide frame 12*a*, the support layer 12 of the metal mask 62 for vapor deposition can function as an adhesive layer when the metal mask 62 for vapor deposition is attached to the frame 52. Therefore, the metal mask 62 for vapor deposition is attached to the frame 52 in a state in which the support layer 12 among all parts of the metal mask 62 for vapor deposition is in contact with the frame 52.

In the thus configured metal mask 62 for vapor deposition, it is recommended to remove, from the invar sheet 11, only a part that overlaps with the through-hole 11*c* of the invar sheet 11 in the thickness direction of the metal mask substrate 10 among all parts of the support layer 12 after the metal mask 62 for vapor deposition is attached to the frame 52. In other words, it is recommended to remove only a part that is an edge part of the support layer 12 and that is a part other than parts positioned outside all through-holes 11*c* among all parts of the support layer 12 in a plan view facing the reverse surface 11*b* of the invar sheet 11.

Figure 23:
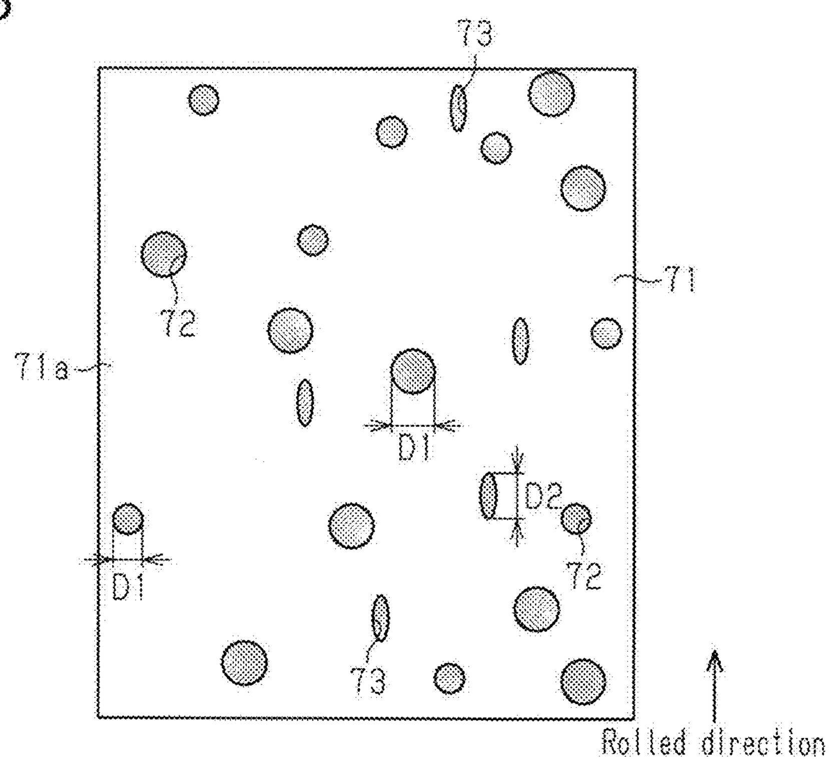
FIG. 23 is a plan view showing a plane structure of an invar sheet in a modification.

FIG. 23 shows a plane structure of an invar sheet, i.e., a plane structure in a plan view facing a resist formation surface that is obtainable by etching an object to be processed in the rolled invar sheet 21. In FIG. 23, dots are given to a first particle trace and to a second particle trace in order to clarify the distinction between the first and second particle traces and the other parts in the resist formation surface.

As shown in FIG. 23, if the thickness by which an object to be processed of the rolled invar sheet 21 is etched is 3 μm or more and 10 μm or less, a surface to be processed 71*a* for resist of an invar sheet 71 has a plurality of first particle traces 72 and a plurality of second particle traces 73. Each of the first particle traces 72 is a hollow that has a hemispherical shape, and the first diameter D1, which is the diameter of the first particle trace 72, is 3 μm or more and 5 μm or less.

Each of the second particle traces 73 is a hollow that is shaped like an elliptic cone, and the second diameter D2, which is the major axis of the second particle trace 73, is 3 μm or more and 5 μm or less, and major axes in the second particle traces 73 are uniform. The major axis direction in each of the second particle traces 73 is a direction parallel to the rolled direction of the invar sheet 71.

The invar sheet 71 is normally manufactured by rolling, and therefore there are not a few cases in which particles composed of oxides, such as a deoxidizer that is added during a process for manufacturing the invar sheet 71, are mixed into the invar sheet 71. Part of the particles that have been mixed into the obverse surface of the invar sheet 71 are extended in the rolled direction of the invar sheet 71 so as to be shaped like an elliptic cone with the major axis aligned with the rolled direction. If such particles remain in a part in which a mask opening is formed in the surface to be processed 71*a* for resist, there is a fear that etching to form the mask opening will be hindered by the particles.

In this respect, the aforementioned configuration makes it possible to obtain the following advantage.

(5) The aforementioned particles have already been removed from the surface to be processed 71*a* for resist, and therefore the surface to be processed 71*a* for resist has the second particle traces 73 shaped like an elliptic cones with aligned major axes, respectively. Therefore, when a mask opening is formed, it is also possible to make the form accuracy or size accuracy of the mask opening higher than in a case in which the particles remain in the invar sheet 71.

The material forming a rolled metal sheet and the material forming a metal mask sheet and a metal sheet may be materials other than invar if the material is a pure metal or an alloy.

Each step of the manufacturing method of the metal mask 51 for vapor deposition may be performed with respect to a rolled invar sheet piece obtained by being beforehand cut into a size corresponding to one metal mask 51 for vapor deposition. In this case, it is possible to obtain a mask for vapor deposition by removing the resist mask and the support layer from an invar sheet piece corresponding to the rolled invar sheet piece.

Alternatively, each step of the manufacturing method of the metal mask substrate 10 may be applied to the rolled invar sheet 21 that has a size corresponding to the metal masks 51 for vapor deposition while the metal mask substrate 10 that has been obtained may be cut into a metal mask substrate piece that has a size corresponding to one metal mask 51 for vapor deposition. Thereafter, forming a resist layer, forming a resist mask, etching an invar sheet, and removing a support layer may be applied to the metal mask substrate piece.

The metal mask 51 for vapor deposition may have a shape, such as a square shape, other than the rectangular shape or may have a shape, such as a polygonal shape, other than the quadrilateral shape in a plan view facing the obverse surface 51*a*.

An opening in the obverse surface 51*a* and an opening in the reverse surface 51*b* among the through-holes 51*c* of the metal mask 51 for vapor deposition may each have a shape, such as a square shape or a circular shape, other than the rectangular shape.

If the aforementioned one direction is a first direction, and a direction perpendicular to the first direction is a second direction in a plan view facing the obverse surface 51*a*, the through-holes 51*c* may be arranged as follows. In detail, the through-holes 51*c* along the first direction make one row, and the through-holes 51*c* are formed with predetermined pitches in the first direction. In every other row of the through-holes 51*c*, the positions in the first direction are equal from each other. On the other hand, in mutually adjoining rows in the second direction, positions in the first direction in the through-holes 51*c* making one row deviate by about ½ pitches with respect to positions in the first direction in the through-holes 51*c* making one other row. In other words, the through-holes 51*c* may be arranged in a staggered manner.

In short, in the metal mask 51 for vapor deposition, the through-holes 51*c* are merely required to be arranged correspondingly to the disposition of an organic layer formed by use of the metal mask 51 for vapor deposition. The through-holes 51*c* are arranged correspondingly to the lattice array in the organic EL device in the embodiment, whereas the through-holes 51*c* in the aforementioned modification are arranged correspondingly to the delta array in the organic EL device.

If the aforementioned one direction is a first direction, and if a direction perpendicular to the first direction is a second direction in a plan view facing obverse surface 51*a*, each of the through-holes 51*c* is away from the other through-holes 51*c* adjoining in the first direction and from the other through-holes 51*c* adjoining in the second direction in the aforementioned embodiment. Without being limited to this, the opening in the obverse surface 51*a* of each of the through-holes 51*c* may be continuous with the opening in the obverse surface 51*a* of each of the other through-holes 51*c* mutually adjoining in the first direction, or may be continuous with the opening in the obverse surface 51*a* of each of the through-holes 51*c* mutually adjoining in the second direction. Alternatively, the opening in the obverse surface 51*a* of each of the through-holes 51*c* may be continuous with the opening in the obverse surface 51*a* of each of the through-holes 51*c* mutually adjoining in both the first direction and the second direction. In the thus configured vapor deposition metal mask, the thickness of a part at which two through-holes 51*c* are continuous with each other may be smaller than the thickness of a part that is at the outer edge of the vapor deposition metal mask and at which the through-hole 51*c* is not positioned, i.e., than the thickness of a part at which etching has not been performed in a step of forming the through-hole 51*c*.

Without being limited to a vapor deposition metal mask that is used in forming the organic layer of the organic EL device, the vapor deposition metal mask may be a vapor deposition metal mask that is used when wirings of various devices, such as a display device, other than the organic EL device are formed or when functional layers or the like of various devices are formed.

DESCRIPTION OF THE REFERENCE NUMERALS

10 . . . Metal mask substrate; 11, 31, 71 . . . Invar sheet; 11*a*, 21*a*, 31*a*, 41*a*, 51*a* . . . Obverse surface; 11*b*, 21*b*, 31*b*, 41*b*, 51*b* . . . Reverse surface; 11*c*, 23*a*, 31*e*, 41*c*, 51*c* . . . Through-hole; 12 . . . Support layer; 12*a* . . . Polyimide frame; 21 . . . Rolled invar sheet; 21*c*, 71*a* . . . resist formation surface; 22 . . . Resist layer; 23 . . . Resist mask; 31*c* . . . First hole; 31*d* . . . Second hole; 41 . . . Metal mask sheet for vapor deposition; 51, 61, 62 . . . Vapor deposition metal mask; 52 . . . Frame; 53 . . . Adhesive layer; 72 . . . First particle trace; 73 . . . Second particle trace; C . . . Central part; S1 . . . First surface layer part; S2 . . . Second surface layer part.

The invention claimed is:

1. A method for manufacturing a metal mask substrate, the method comprising:

preparing a rolled metal sheet having a length extending from one end to an opposing end of the rolled metal sheet and the rolled metal sheet including an obverse surface and a reverse surface that is a surface located opposite to the obverse surface, at least one of the obverse surface or the reverse surface being an object to be processed;

reducing a thickness of the rolled metal sheet, along the length of the rolled metal sheet, to 10 μm or less by etching the object to be processed by 3 μm or more by use of an acidic etching liquid such that a maximum thickness of the rolled metal sheet is 10 μm or less, and roughening the object to be processed so that the processed object becomes a resist formation surface that has a surface roughness Rz of 0.2 μm or more, wherein a metal mask sheet is configured for through holes to be formed in areas of the metal mask sheet having a thickness of 10 μm or less.

2. The method for manufacturing a metal mask substrate according to claim 1, wherein the object to be processed comprises both the obverse surface and the reverse surface.

3. The method for manufacturing a metal mask substrate according to claim 1, wherein the object to be processed is either the obverse surface or the reverse surface, the method further comprising stacking a plastic support layer on a surface located opposite to the object to be processed, the object to be processed is etched in a state in which the rolled metal sheet and the support layer are stacked together, thereby obtaining a metal mask substrate, in which the metal mask sheet and the support layer are stacked together.

4. The method for manufacturing a metal mask substrate according to claim 2, wherein the etching includes etching a first object to be processed that is either the obverse surface or the reverse surface and then etching a second object to be processed that is the remaining one of the obverse surface or the reverse surface, the method further comprises etching the first object to be processed and then stacking a plastic support layer on the resist formation surface that has been obtained by etching the first object to be processed, the second object to be processed is etched in a state in which the rolled metal sheet and the support layer are stacked together, thereby obtaining a metal mask substrate in which the metal mask sheet and the support layer are stacked together.

5. The method for manufacturing a metal mask substrate according to claim 1, wherein the rolled metal sheet is a rolled invar sheet, and the metal mask sheet is an invar sheet.

6. The method for manufacturing a metal mask substrate according to claim 1, additionally comprising forming through holes in the metal mask sheet.

7. The method for manufacturing a metal mask substrate according to claim 1, wherein after the roughening of the object to be processed the method further comprises:

forming a resist layer on the processed object;

forming a resist mask by subjecting the resist layer to patterning;

etching completely through the metal mask sheet from the resist mask side of the metal mask sheet to form the through holes between the obverse surface and the reverse surface, wherein through hole connection portions are eliminated.

8. A method for manufacturing a vapor deposition metal mask, the method comprising:

forming a metal mask substrate that includes at least one resist formation surface;

forming a resist layer on the one resist formation surface;

forming a resist mask by subjecting the resist layer to patterning; and etching the metal mask substrate by use of the resist mask, wherein the metal mask substrate is formed by use of the method for manufacturing a metal mask substrate according to claim 1.

9. The method for manufacturing a vapor deposition metal mask according to claim 8, wherein the metal mask substrate includes a laminate of the metal mask sheet and a plastic support layer, and the method further comprises chemically removing the support layer from the metal mask substrate by exposing, to alkaline solution, the metal mask substrate, on which the resist mask has been formed.

* * * * *